US011094749B2

(12) United States Patent
Huangfu et al.

(10) Patent No.: US 11,094,749 B2
(45) Date of Patent: Aug. 17, 2021

(54) PIXEL ARRANGEMENT STRUCTURE WITH MISALIGNED REPEATING UNITS, DISPLAY SUBSTRATE, DISPLAY APPARATUS AND METHOD OF FABRICATION THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lujiang Huangfu, Beijing (CN); Libin Liu, Beijing (CN); Fengli Ji, Beijing (CN); Xiaodan Jin, Beijing (CN); Yinan Liang, Beijing (CN); Mei Li, Beijing (CN); Jie Zhang, Beijing (CN); Chang Luo, Beijing (CN); Jianpeng Wu, Beijing (CN); Hongli Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/600,316

(22) Filed: Oct. 11, 2019

(65) Prior Publication Data
US 2020/0043990 A1    Feb. 6, 2020

Related U.S. Application Data

(63) Continuation-in-part of application No. 15/578,481, filed as application No. PCT/CN2017/075957 on
(Continued)

(30) Foreign Application Priority Data

Feb. 18, 2016  (CN) .......................... 201620127445.0
Jul. 22, 2016  (CN) .......................... 201610585894.4
(Continued)

(51) Int. Cl.
*H01L 27/32*    (2006.01)
*G09G 3/3225*   (2016.01)
(Continued)

(52) U.S. Cl.
CPC ....... *H01L 27/3218* (2013.01); *G09G 3/3225* (2013.01); *G09G 3/3233* (2013.01);
(Continued)

(58) Field of Classification Search
CPC .............. H01L 27/3218; H01L 51/001; H01L 51/0011; H01L 51/56; G09G 2300/0452; G09G 3/3607; G02F 2201/52
See application file for complete search history.

(56) References Cited

U.S. PATENT DOCUMENTS 4,491,863 A    1/1985   Kurahashi
4,652,912 A    3/1987   Masabuchi
(Continued)

FOREIGN PATENT DOCUMENTS

CN    101192382 A    6/2008
CN    102201430 A    9/2011
(Continued)

OTHER PUBLICATIONS

English translation of Extended European Search Report in EP Application No. 17768339.8 dated Jun. 12, 2019.
(Continued)

*Primary Examiner* — Peter Bradford
(74) *Attorney, Agent, or Firm* — Collard & Roe, P.C.

(57) ABSTRACT

A pixel arrangement structure are provided, which includes a plurality of repeating units. Each of the plurality of
(Continued)

repeating units includes two first sub-pixels, one second sub-pixel, and one third sub-pixel. Each of the first sub-pixel, the second sub-pixel and the third sub-pixel includes a pixel defining layer, the pixel defining layer includes a pixel defining layer opening to define an effective light emitting region of each sub-pixel; a plurality of first sub-pixels are arranged along the second direction to form a plurality of first sub-pixel groups, orthographic projections of pixel defining layer openings of the first sub-pixels in adjacent ones of the plurality of first sub-pixel groups on a straight line parallel to the second direction do not overlap each other.

20 Claims, 10 Drawing Sheets

Related U.S. Application Data

Mar. 8, 2017, now abandoned, application No. 16/600,316, which is a continuation-in-part of application No. PCT/CN2019/098707, filed on Jul. 31, 2019, and a continuation-in-part of application No. PCT/CN2019/098705, filed on Jul. 31, 2019, and a continuation-in-part of application No. PCT/CN2019/086875, filed on May 14, 2019, which is a continuation of application No. 16/234,777, filed on Dec. 28, 2018, now Pat. No. 10,854,684, which is a continuation-in-part of application No. 15/536,347, filed as application No. PCT/CN2016/081097 on May 5, 2016, now Pat. No. 10,274,654, said application No. 16/234,777 is a continuation-in-part of application No. 15/578,481, filed on Nov. 30, 2017, now abandoned.

(30) Foreign Application Priority Data

| Feb. 9, 2018 | (CN) | 201810135947.1 |
|---|---|---|
| Feb. 9, 2018 | (CN) | 201810135948.6 |
| Feb. 9, 2018 | (CN) | 201810136335.4 |
| Feb. 9, 2018 | (CN) | 201810137012.7 |
| Feb. 9, 2018 | (CN) | 201810137014.6 |
| Feb. 9, 2018 | (CN) | 201810137016.5 |
| Dec. 13, 2018 | (CN) | 201811525578.3 |

(51) Int. Cl.
  *H01L 51/52* (2006.01)
  *G09G 3/3233* (2016.01)
(52) U.S. Cl.
  CPC ...... *H01L 27/3246* (2013.01); *H01L 27/3276* (2013.01); *H01L 27/3279* (2013.01); *H01L 51/525* (2013.01); *G09G 2300/0452* (2013.01); *G09G 2300/0842* (2013.01); *G09G 2310/0251* (2013.01); *G09G 2310/0262* (2013.01); *H01L 27/3216* (2013.01)

(56) References Cited

U.S. PATENT DOCUMENTS

| 5,113,274 | A | 5/1992 | Takahashi et al. |
|---|---|---|---|
| 5,341,153 | A | 8/1994 | Benzschawel et al. |
| 6,681,053 | B1 | 1/2004 | Zhu |
| 6,768,482 | B2 | 7/2004 | Asano et al. |
| 6,950,115 | B2 | 9/2005 | Brown Elliott |
| 7,663,299 | B2 | 2/2010 | Chao et al. |
| 7,733,359 | B1 | 6/2010 | Hagge et al. |
| 8,159,508 | B2 | 4/2012 | Lee |
| 8,363,072 | B2 | 1/2013 | Hong et al. |
| 8,446,435 | B2 | 5/2013 | Tomizawa et al. |
| 8,754,913 | B2 | 6/2014 | Hwang et al. |
| 8,994,015 | B2 | 3/2015 | Pyon et al. |
| 9,343,511 | B1 | 5/2016 | Feng |
| 9,424,771 | B2 | 8/2016 | Gong |
| 9,697,760 | B2 | 7/2017 | Wang |
| 9,704,926 | B2 | 7/2017 | Kim |
| 9,818,803 | B2 | 11/2017 | Lee |
| 9,871,085 | B2 | 1/2018 | Cho et al. |
| 9,905,604 | B2 | 2/2018 | Murata |
| 9,946,123 | B2 | 4/2018 | Huangfu et al. |
| 9,984,624 | B2 | 5/2018 | Takahashi et al. |
| 10,026,785 | B2 | 7/2018 | Bai et al. |
| 10,068,541 | B2 | 9/2018 | Sakaigawa |
| 10,274,654 | B2 | 4/2019 | Jin et al. |
| 10,520,775 | B2 | 12/2019 | You et al. |
| 10,579,173 | B2 | 3/2020 | Xu et al. |
| 10,699,642 | B2 | 6/2020 | Ma et al. |
| 2005/0018110 | A1 | 1/2005 | Liu |
| 2007/0205423 | A1 | 9/2007 | Yamazaki et al. |
| 2007/0290973 | A1 | 12/2007 | Vvei |
| 2008/0001525 | A1 | 1/2008 | Chao et al. |
| 2009/0121983 | A1 | 5/2009 | Sung et al. |
| 2009/0302331 | A1 | 12/2009 | Smith et al. |
| 2011/0127506 | A1 | 6/2011 | So |
| 2011/0128262 | A1 | 6/2011 | Chaji et al. |
| 2011/0260951 | A1 | 10/2011 | Hwang et al. |
| 2011/0291549 | A1 | 12/2011 | Kim et al. |
| 2012/0039034 | A1 | 2/2012 | Jepsen et al. |
| 2012/0092238 | A1 | 4/2012 | Hwang et al. |
| 2012/0313844 | A1 | 12/2012 | Im et al. |
| 2013/0234917 | A1 | 9/2013 | Lee |
| 2014/0003045 | A1 | 1/2014 | Lee et al. |
| 2014/0198479 | A1 | 7/2014 | Chao et al. |
| 2014/0226323 | A1 | 8/2014 | Huang et al. |
| 2014/0252321 | A1 | 9/2014 | Pyon et al. |
| 2014/0292622 | A1 | 10/2014 | Lee |
| 2015/0015465 | A1 | 1/2015 | Gong |
| 2015/0021637 | A1 | 1/2015 | Ann et al. |
| 2015/0102320 | A1 | 4/2015 | Jung |
| 2015/0270317 | A1 | 9/2015 | Lee et al. |
| 2015/0364525 | A1 | 12/2015 | Lin et al. |
| 2016/0049438 | A1 | 2/2016 | Murata |
| 2016/0126296 | A1 | 5/2016 | Feng |
| 2016/0126298 | A1 | 5/2016 | Chen |
| 2016/0155781 | A1 | 6/2016 | Chaji |
| 2016/0171918 | A1 | 6/2016 | Kim et al. |
| 2016/0190523 | A1 | 6/2016 | Kim et al. |
| 2016/0196776 | A1 | 7/2016 | Yang et al. |
| 2016/0293678 | A1 | 10/2016 | Wang |
| 2016/0343284 | A1* | 11/2016 | Sun ............... H01L 27/3218 |
| 2016/0351119 | A1* | 12/2016 | Ono ............... H01L 51/56 |
| 2016/0357076 | A1 | 12/2016 | Huangfu et al. |
| 2016/0358985 | A1 | 12/2016 | Bai et al. |
| 2016/0370919 | A1 | 12/2016 | Xu et al. |
| 2017/0193880 | A1 | 7/2017 | Lee et al. |
| 2017/0294491 | A1* | 10/2017 | Jo ............... G09G 3/2003 |
| 2017/0317150 | A1 | 11/2017 | Chung et al. |
| 2017/0352710 | A1* | 12/2017 | Hong ............... H01L 27/3218 |
| 2018/0012547 | A1 | 1/2018 | Li et al. |
| 2018/0088260 | A1 | 3/2018 | Jin et al. |
| 2018/0097043 | A1 | 4/2018 | Song |
| 2018/0247984 | A1* | 8/2018 | Wang ............... H01L 27/3216 |
| 2018/0308907 | A1 | 10/2018 | Jin et al. |
| 2019/0035859 | A1 | 1/2019 | Kang et al. |
| 2019/0066564 | A1 | 2/2019 | Tan |
| 2019/0115399 | A1 | 4/2019 | Jo et al. |
| 2019/0206341 | A1 | 7/2019 | Liao et al. |
| 2019/0237518 | A1 | 8/2019 | Sun et al. |
| 2019/0333970 | A1 | 10/2019 | Lee |
| 2020/0035172 | A1 | 1/2020 | Chen |

FOREIGN PATENT DOCUMENTS

| CN | 104037202 A | 9/2014 |
|---|---|---|
| CN | 104051493 A | 9/2014 |
| CN | 104269411 A | 1/2015 |
| CN | 104282727 A | 1/2015 |

(56) References Cited

FOREIGN PATENT DOCUMENTS

| | | |
|---|---|---|
| CN | 104332486 A | 2/2015 |
| CN | 104362170 A | 2/2015 |
| CN | 104597655 A | 5/2015 |
| CN | 104701341 A | 6/2015 |
| CN | 104795431 A | 7/2015 |
| CN | 104882464 A | 9/2015 |
| CN | 105280139 A | 1/2016 |
| CN | 205231065 U | 5/2016 |
| CN | 205355055 U | 6/2016 |
| CN | 105938266 A | 9/2016 |
| CN | 205608350 U | 9/2016 |
| CN | 205845956 U | 12/2016 |
| CN | 106293244 A | 1/2017 |
| CN | 106601167 A | 4/2017 |
| CN | 106782307 A | 5/2017 |
| CN | 106935618 A | 7/2017 |
| CN | 106935630 A | 7/2017 |
| CN | 107248378 A | 10/2017 |
| CN | 107256695 A | 10/2017 |
| CN | 107275359 A | 10/2017 |
| CN | 107393468 A | 11/2017 |
| CN | 107481671 A | 12/2017 |
| CN | 107644888 A | 1/2018 |
| CN | 107665684 A | 2/2018 |
| CN | 107817632 A | 3/2018 |
| CN | 107910348 A | 4/2018 |
| CN | 207781607 U | 8/2018 |
| CN | 207781608 U | 8/2018 |
| CN | 207883217 U | 9/2018 |
| CN | 109491158 A | 3/2019 |
| CN | 109559679 A | 4/2019 |
| EP | 2 680 310 A1 | 1/2014 |
| EP | 2 709 155 A1 | 3/2014 |
| EP | 3 270 216 A1 | 1/2018 |
| JP | 2002-221917 A | 8/2002 |
| JP | 2005-091875 A | 4/2005 |
| JP | 2008-015521 A | 1/2008 |
| JP | 2008197491 A | 8/2008 |
| JP | 2016-090991 A | 5/2016 |
| KR | 10-2009-0049515 A | 5/2009 |
| KR | 10-2011-0108050 A | 10/2011 |
| KR | 10-2013-0101874 A | 9/2013 |
| KR | 101347995 B1 | 1/2014 |
| KR | 10-2015-0006668 A | 1/2015 |
| KR | 20160051511 A | 5/2016 |
| WO | 2017/140038 A1 | 8/2017 |

OTHER PUBLICATIONS

Korean Notice of Allowance in Korean Application No. 10-2017-7022698, dated Mar. 6, 2020 with English translation.
Chinese Office Action in Chinese Application No. 201810135947.1, dated Mar. 3, 2020 with English translation.
International Search Report of PCT/CN2019/098705 in Chinese, dated May 6, 2020, with English translation.
Notice of Transmittal of the International Search Report of PCT/CN2019/098705 in Chinese, dated May 6, 2020.
Written Opinion of the International Searching Authority of PCT/CN2019/098705 in Chinese, dated May 6, 2020 with English translation.
International Search Report of PCT/CN2019098707 in Chinese, dated May 9, 2020, with English translation.
Notice of Transmittal of the International Search Report of PCT/CN2019098707 in Chinese, dated May 9, 2020.
Written Opinion of the International Searching Authority of PCT/CN2019098707 in Chinese, dated May 9, 2020 with English translation.
First Office Action in U.S. Appl. No. 16/492,930 dated Jul. 24, 2020.
Korean Office Action in Korean Application No. 10-2019-7024785, dated Jul. 30, 2020 with English translation.
International Search Report of PCT/CN2018/124890 in Chinese, dated Mar. 27, 2019, with English translation.
Written Opinion of the International Searching Authority of PCT/PCT/CN2018/124890 in Chinese, dated Mar. 27, 2019 with English translation.
Notice of Transmittal of the International Search Report of PCT/CN2018/124890 in Chinese, dated Mar. 27, 2019.
International Search Report of PCT/CN2018124881 in Chinese, dated Mar. 26, 2019, with English translation.
Written Opinion of the International Searching Authority of PCT/CN2018124881 in Chinese, dated Mar. 26, 2019, with English translation.
Notice of Transmittal of the International Search Report of PCT/CN2018124881 in Chinese, dated Mar. 26, 2019.
International Search Report of PCT/CN2018/124386 in Chinese, dated Mar. 29, 2019, with English translation.
Written Opinion of the International Searching Authority of PCT/CN2018/124386 in Chinese, dated Mar. 29, 2019, with English translation.
Notice of Transmittal of the International Search Report of PCT/CN2018/124386 in Chinese, dated Mar. 29, 2019.
International Search Report of PCT/CN2018/124884 in Chinese, dated Mar. 27, 2019, with English translation.
Written Opinion of the International Searching Authority of PCT/CN2018/124884 in Chinese, dated Mar. 27, 2019, with English translation.
Notice of Transmittal of the International Search Report of PCT/CN2018/124884 in Chinese, dated Mar. 27, 2019.
International Search Report of PCT/CN2018/124445 in Chinese, dated Mar. 21, 2019, with English translation.
Written Opinion of the International Searching Authority of PCT/CN2018/124445 in Chinese, dated Mar. 21, 2019, with English translation.
Notice of Transmittal of the International Search Report of PCT/CN2018/124445 in Chinese, dated Mar. 21, 2019.
International Search Report of PCT/CN2018/124404 in Chinese, dated Mar. 14, 2019, with English translation.
Written Opinion of the International Searching Authority of PCT/CN2018/124404 in Chinese, dated Mar. 14, 2019, with English translation.
Notice of Transmittal of the International Search Report of PCT/CN2018/124404 in Chinese, dated Mar. 14, 2019.
U.S. First Office Action in U.S. Appl. No. 15/578,481, dated Feb. 1, 2019.
Messing, Dean et al, Improved Display Resolution of Subsampled Colour Images Using Subpixel Addressing, EEE ICIP 2002, pp. 625-628.
Huang et al, RGB to RGB conversion algorithm based upon weighting factors and related FPGA realization; Chinese journal of Liquid Crystals and Displays, vol. 32 No. 7, Jul. 2017 pp. 572-579.
Candice Hellen Brown Elliot, Reducing Pixel Count Without Reducing Image Quality, Information Display, Dec. 1999.
Fang et al, Subpixel Rendering: From Font Rendering to Image Subsampling IEEE Signal Processing Magazine, May 2013, pp. 177-182, 189.
Non-Final Office Action in U.S. Appl. No. 15/536,347, dated Aug. 28, 2018.
Notice of Allowance in U.S. Appl. No. 16/234,777 dated Sep. 1, 2020.
First Office Action in U.S. Appl. No. 16/621,918 dated Sep. 29, 2020.
International Search Report of PCT/CN2016/081097 in Chinese, dated Nov. 16, 2016, with English translation.
International Preliminary Report on Patentability of PCT/CN2016/081097, dated Aug. 21, 2018 and English Translation of the Written Opinion of the International Searching Authority of PCT/CN2016/081097, dated Nov. 16, 2016.
Japanese Office Action in Japanese Application No. 2017-544608, dated Oct. 12, 2020 with English translation.
Korean Office Action in Korean Application No. 10-2019-7027773, dated Dec. 25, 2020 with English translation.
Extended European Search Report in European Patent Application No. 21152119.0 dated May 11, 2021.
Indian Office Action in Indian Application No. 202017026082 dated May 25, 2021 with English translation.

(56) References Cited

OTHER PUBLICATIONS

Notice of Allowance in U.S. Appl. No. 16/630,496 dated Mar. 26, 2021.
Park et al., Luminance Uniformity of Large-Area OLEDs With an Auxiliary Metal Electrode. Journal of Display Technology, pp. 306-311, vol. 5, No. 8, Aug. 2009, National Library of China, Downloaded on Jun. 2, 2021 from IEEE Xplore.

* cited by examiner

PIXEL ARRANGEMENT STRUCTURE WITH MISALIGNED REPEATING UNITS, DISPLAY SUBSTRATE, DISPLAY APPARATUS AND METHOD OF FABRICATION THEREOF

CROSS-REFERENCE TO RELATED APPLICATIONS

This application is a continuation in part of U.S. Ser. No. 15/578,481 filed on Nov. 30, 2017 which is a national stage application of international application PCT/CN2017/075957 filed on Mar. 8, 2017, which claims priority from CN201610585894.4 filed on Jul. 22, 2016.

This application is a continuation in part application of PCT/CN2019/098707 filed on Jul. 31, 2019. This application is also a continuation in part of PCT/CN2019/098705 filed on Jul. 31, 2019.

This application is also a continuation in part application of PCT/CN2019/086875 filed on May 14, 2019, which claims priority from U.S. Ser. No. 16/234,777 filed on Dec. 28, 2018 (hereinafter the 777 application) which is a continuation in part of U.S. Ser. No. 15/536,347 filed on Jun. 15, 2017, now issued as Ser. No. 10,274,654, on Apr. 30, 2019 which is a national stage application of international application PCT/CN2016/081097 filed on May 5, 2016, which claims priority from CN201620127445.0 filed Feb. 18, 2016.

The 777 application is also a continuation in part application of Ser. No. 15/578,481 filed on Nov. 30, 2017 which is a national stage application of international application PCT/CN2017/075957 filed on Mar. 8, 2017 which claims priority from CN 201610585894.4 filed on Jul. 22, 2016.

The 777 application also claims priority under 35 U.S.C. 119 from the following applications CN 201810135947.1 filed on Feb. 9, 2018, CN 201810137012.7 filed on Feb. 9, 2018, CN 201810136335.4 filed on Feb. 9, 2018, CN 201810135948.6 filed on Feb. 9, 2018, CN 201810137016.5 filed on Feb. 9, 2018, CN 201810137014.6 filed on Feb. 9, 2018, CN 201811525578.3 filed on Dec. 13, 2018.

The disclosures of all of these applications are hereby incorporated herein by reference in their entirety.

TECHNICAL FIELD

This invention relates to a display technology, and more particularly, to a pixel arrangement structure, display substrate, display device, and method of manufacturing thereof.

BACKGROUND

The requirement that display devices have high display resolution increases the difficulty of manufacturing and cost of the display device. In particular, in the present AMOLED (Active Matrix Organic Light-Emitting Diode) field, due to the limitations of the FMM (Fine Metal Mask) technology, it is difficult to produce a high PPI (Pixel per inch, pixel density) display device.

Three sub-pixels RGB are to be arranged within a pixel spacing in the direction perpendicular to the direction of the stripe sub-pixel in a pixel made of stripe RGB sub-pixels (stripe RGB). As such, when pixel density is greater than 300 ppi, it is very difficult for the present FMM process to achieve the desired pixel density.

BRIEF SUMMARY

Accordingly, one example of the present disclosure is a pixel arrangement structure. The pixel arrangement structure comprises a first pixel and a second pixel. The first pixel has a first side and a third side opposite the first side. The second pixel has a first side and a third side opposite the first side. The first pixel and the second pixel are alternately in a row direction and a column direction. The first pixel and the second pixel each comprise a first sub-pixel, a second sub-pixel, and a third sub-pixel. The first sub-pixel, the second sub-pixel, and the third sub-pixel in the first pixel form a triangular distribution. The first sub-pixel, the second sub-pixel, and the third sub-pixel in the second pixel form an inverted triangular distribution relative to the triangular distribution in the first pixel. The second sub-pixel and the third sub-pixel in each of the first pixel and the second pixel are located on substantially the same row. In one embodiment, the second sub-pixel and the third sub-pixel in each of the first pixel and the second pixel are located on the same row.

The first sub-pixel in each of the first pixel and the second pixel may be at a center region of the pixel. The first sub-pixel in each of the first pixel and the second pixel may be a green sub-pixel. The second sub-pixel and the third sub-pixel in each of the first pixel and the second pixel may be at an edge region of the pixel. In the first pixel, an edge of the second sub-pixel opposite to the first sub-pixel and an edge of the third sub-pixel opposite to the first sub-pixel may be in close proximity to the first side of the first pixel. In the second pixel adjacent to the first pixel in the row direction, an edge of the second sub-pixel opposite to the first sub-pixel and an edge of the third sub-pixel opposite to the first sub-pixel may be in close proximity to the third side of the second pixel. The first side of the first pixel and the third side of the second pixel may be located on two opposite sides of the first sub-pixels of the first pixel and the second pixel respectively. In the first pixel, the first sub-pixel may be within a region between the third side and the second and third sub-pixels. In the second pixel, the first sub-pixel is within a region between the first side and the second and third sub-pixels. In one embodiment, the edge of the second sub-pixel opposite to the first sub-pixel and the edge of the third sub-pixel opposite to the first sub-pixel in the first pixel overlap with the first side. The edge of the second sub-pixel opposite to the first sub-pixel and the edge of the third sub-pixel opposite to the first sub-pixel in the second pixel overlap with the third side.

In the first pixel, a vertical distance from a center of the first sub-pixel to the third side may be smaller than a vertical distance from the center of the first sub-pixel to the first side. In the second pixel, a vertical distance from a center of the first sub-pixel to the first side may be smaller than a vertical distance from the center of the first sub-pixel to the third side.

In each of the first pixel and the second pixel, an edge of the first sub-pixel adjacent to the second sub-pixel and the third sub-pixel may be in close proximity to a second straight line. The second straight line is a line parallel to the row direction and at equal vertical distance to the first side and the third side. In one embodiment, the edge of the first sub-pixel adjacent to the second sub-pixel and the third sub-pixel overlap with the second straight line.

The first sub-pixel, the second sub-pixel, and the third sub-pixel of the same pixel may form an isosceles triangle distribution. Each of the first pixel and the second pixel may be a rectangular or square pixel. In each of the first pixel and the second pixel, the second sub-pixel and the third sub-pixel may be located near two corners of the rectangular or square pixel in the row direction, with two adjacent perpendicular edges of the second sub-pixel and two adjacent perpendicular edges of the third sub-pixel in close proximity to two adjacent perpendicular edges of the rectangular or square pixel, respectively. In one embodiment, the two adjacent perpendicular edges of the second sub-pixel and the two adjacent perpendicular edges of the third sub-pixel overlap with the two adjacent perpendicular edges of the rectangular or square pixel, respectively.

The first sub-pixel may be positioned on a perpendicular bisector of the second sub-pixel and the third sub-pixel. In one embodiment, a center of the first sub-pixel is located on the perpendicular bisector of the second sub-pixel and the third sub-pixel. Each of the first sub-pixel, the second sub-pixel and the third sub-pixel may be a rectangle or square sub-pixel.

The first pixel and the second pixel adjacent to each other in a column direction may be mirror-symmetric. The second sub-pixel and the third sub-pixel in the first pixel are adjacent to the second sub-pixel and the third sub-pixel in the second pixel adjacent to the first pixel in the column direction respectively. In one embodiment, at least one pair of the adjacent second sub-pixels or the adjacent third sub-pixels may be integrated.

Another example of the present disclosure is a display substrate including the pixel arrangement structure in accordance with one embodiment of the present disclosure. The display substrate may be an OLED display substrate.

Another example of the present disclosure is a display device comprising the display substrate in accordance with one embodiment of the present disclosure.

Another example of the present disclosure is a method of manufacturing a display substrate, comprising the steps of forming the display substrate in accordance with one embodiment of the present disclosure. The display substrate may be an OLED display substrate. The method may comprise forming a sub-pixel of the OLED display substrate by an evaporation deposition technique using an FMM mask plate. The FMM mask plate may include at least one first opening. The first opening may correspond to at least two adjacent sub-pixels of the same color.

Another example of the present disclosure is an FMM mask used for forming the display substrate in accordance with one embodiment of the present disclosure. The FMM mask plate may include at least one first opening. The first opening may correspond to at least two adjacent sub-pixels of the same color.

Another example of the present disclosure is a pixel arrangement structure, comprising a plurality of repeating units, wherein each of the plurality of repeating units comprises two first sub-pixels, one second sub-pixel, and one third sub-pixel; in each of the plurality of repeating units, the two first sub-pixels form a first sub-pixel pair; the one second sub-pixel, the first sub-pixel pair, and the one third sub-pixel are arranged in a first direction; and the two first sub-pixels in the first sub-pixel pair are arranged in a second direction intersecting the first direction; the plurality of repeating units are arranged in the first direction to form a plurality of repeating unit groups, and the plurality of repeating unit groups are arranged in the second direction; the repeating units in adjacent ones of the plurality of repeating unit groups are misaligned with each other in the second direction, and the repeating units in two repeating unit groups separated from each other by one repeating unit group are aligned with each other in the second direction, each of the first sub-pixel, the second sub-pixel and the third sub-pixel comprises a pixel defining layer, the pixel defining layer comprises a pixel defining layer opening to define an effective light emitting region of each sub-pixel; a plurality of first sub-pixels are arranged along the second direction to form a plurality of first sub-pixel groups, orthographic projections of pixel defining layer openings of the first sub-pixels in adjacent ones of the plurality of first sub-pixel groups on a straight line parallel to the second direction do not overlap each other.

In some examples, each of the first sub-pixel, the second sub-pixel and the third sub-pixel further comprises an anode electrode, an orthographic projection of the pixel defining layer opening on a plane defined by the first direction and the second direction falls within an orthographic projection of the anode electrode on the plane.

In some examples, each of the first sub-pixel, the second sub-pixel and the third sub-pixel further comprises a light emitting functional layer, the orthographic projection of the anode electrode on the plane falls within an orthographic projection of the light emitting functional layer on the plane, each of the first sub-pixel, the second sub-pixel and the third sub-pixel further comprises a connection electrode; in each of the first sub-pixel, the second sub-pixel and the third sub-pixel, the connection electrode is electrically connected with the anode electrode, and the connection electrode at least partially overlaps with the light emitting functional layer.

In some examples, in each of the second sub-pixel and the third sub-pixel, the light emitting functional layer comprises an annular portion on the pixel defining layer surrounding the pixel defining layer opening; in the first sub-pixel pair, the light emitting functional layer comprises an annular portion on the pixel defining layer surrounding the pixel defining layer openings of the two first sub-pixels and a connection portion on the pixel defining layer between the pixel defining layer openings of the two first sub-pixels; in each of the first sub-pixel pair, the second sub-pixel and the third sub-pixel, the annular portion of the light emitting functional layer has an equal width at each position.

In some examples, at least the annular portion and the connection portion of the light emitting functional layer of the first sub-pixel pair are configured to be a continuous layer structure.

In some examples, for the first sub-pixel pair, the second sub-pixel and the third sub-pixel, any two adjacent light emitting layers in the first direction abut with each other.

In some examples, an area of the light emitting functional layer of one first sub-pixel pair is greater than an area of the light emitting functional layer of one second sub-pixel, the area of the light emitting functional layer of the one second sub-pixel is greater than an area of the light emitting functional layer of one third sub-pixel, the first sub-pixel is a green sub-pixel, the second sub-pixel is a blue sub-pixel, and the third sub-pixel is a red sub-pixel.

In some examples, the light emitting functional layers of the first sub-pixel pair and the second sub-pixel adjacent to each other in the second direction abut with each other, the light emitting functional layers of the third sub-pixel and the first sub-pixel pair adjacent to each other in the second direction are spaced apart from each other, the light emitting functional layers of the third sub-pixel and the second sub-pixel adjacent to each other in the second direction are spaced apart from each other, and the interval between the light emitting functional layers of the third sub-pixel and the second sub-pixel adjacent to each other in the second direction is greater than the interval of the light emitting functional layers of the third sub-pixel and the first sub-pixel pair adjacent to each other in the second direction.

In some examples, the first sub-pixel, the second sub-pixel and the third sub-pixel each comprises a sub-pixel circuit for driving, the sub-pixel circuit is disposed on a side of the anode electrode away from the light emitting functional layer, the anode electrode is connected to the sub-pixel circuit through the connection electrode, the pixel arrangement structure further comprises: a plurality of reset power signal lines extending in the first direction and a plurality of data lines extending in the second direction, the plurality of reset power signal lines and the plurality of data lines cross each other to define a plurality of sub-circuit regions, the sub-pixel circuits in respective sub-pixels of the plurality of repeating units are disposed in the plurality of sub-circuit regions.

In some examples, in one repeating unit, the sub-pixel circuit of the second sub-pixel at least partially overlaps the anode electrode of the second sub-pixel, the sub-pixel circuit of the third sub-pixel at least partially overlaps the anode electrode of the third sub-pixel, the sub-pixel circuit of one first sub-pixel of the first sub-pixel pair is located between the sub-pixel circuits of the second sub-pixel and the third sub-pixel, and partially overlaps two anode electrodes of the first sub-pixel pair, the sub-pixel circuit of the other first sub-pixel of the first sub-pixel pair is located between the sub-pixel circuits of one second sub-pixel and one third sub-pixel in another repeating unit group adjacent to the other first sub-pixel, and the sub-pixel circuits of the two first sub-pixels in the first sub-pixel pair are arranged in the second direction.

In some examples, the pixel arrangement structure comprises a first virtual pixel and a second virtual pixel, one first virtual pixel comprising one first sub-pixel and one second sub-pixel, and one second virtual pixel comprising one first sub-pixel and one third sub-pixel, wherein the plurality of repeating unit groups arranged in the second direction are allocated a serial number of i sequentially, one second sub-pixel and one first sub-pixel in the first sub-pixel pair in one repeating unit in the ith repeating unit group form the first virtual pixel, the one first sub-pixel is one of the first sub-pixel pair adjacent to the (i+1)th repeating unit group, one third sub-pixel in the one repeating unit in the ith repeating unit group and one first sub-pixel located in the (i+1)th repeating unit group and adjacent to the one third sub-pixel form the second virtual pixel, i is positive integers.

In some examples, the pixel arrangement comprises a third virtual pixel and a fourth virtual pixel, one third virtual pixel comprising one first sub-pixel and one second sub-pixel, and one fourth virtual pixel comprising one first sub-pixel and one third sub-pixel, wherein the plurality of repeating unit groups arranged in the second direction are allocated a serial number of j sequentially, one second sub-pixel in one repeating unit in the jth repeating unit group and one first sub-pixel which is adjacent to the one second sub-pixel and from the (j−i)th repeating unit group form the third virtual pixel, and one third sub-pixel in the one repeating unit the jth repeating unit group and one first sub-pixel which is adjacent to the one third sub-pixel and from the (j+i)th repeating unit group form the fourth virtual pixel, j is positive integers.

In some examples, the first sub-pixel on a first side of the first sub-pixel pair in the second direction comprises a first via hole, the first sub-pixel on a second side of the first sub-pixel pair in the second direction comprises a second via hole, the first via hole is located on a side of the pixel defining layer opening of the first sub-pixel away from the second via hole, the second via hole is located on a side of the pixel defining layer opening of the first sub-pixel away from the first via hole, the second sub-pixel comprises a third via hole, the third sub-pixel comprises a fourth via hole, the connection electrodes of the two first sub-pixels of the first sub-pixel pair, the second sub-pixel, and the third sub-pixel are respectively electrically connected to the corresponding sub-pixel circuits through the first via hole, the second via hole, the third via hole and the fourth via hole, in each repeating unit group, the first via hole, the third via hole and the fourth via hole are located on a first side of the repeating unit group in the second direction, and are arranged in a straight line parallel to the first direction, and a distance between the third via hole and the fourth via hole is greater than a distance between the first via hole and the third via hole; the second via hole corresponding to the repeating unit group is located on a second side of the repeating unit group in the second direction and the first via hole, the third via hole and the fourth via hole in another repeating unit group adjacent to the second side of the first sub-pixel pair are arranged in the straight line parallel to the first direction, the via holes located on one side of each repeating unit group in the second direction are repeatedly arranged in sequence according to an order of the first via hole, the third via hole, the second via hole and the fourth via hole.

In some examples, two edges opposite to each other of the pixel defining layer openings of the two first sub-pixels in the first sub-pixel pair extend in the first direction, the pixel defining layer openings of any adjacent two of the first sub-pixel, the second sub-pixel and the third sub-pixel have approximately parallel opposite edges, and a perpendicular bisector of one edge of the opposite edges passes through the other edge.

In some examples, a minimum distance between any two of the pixel defining layer opening of the first sub-pixel pair, the pixel defining layer opening of the second sub-pixel and the pixel defining layer opening of the third sub-pixel is a first distance, a minimum distance between the pixel defining layer openings of the two first sub-pixels of the first sub-pixel pair is a second distance, and the second distance is less than the first distance.

In some examples, the first distance is in a range of 18~26 μm, and the second distance is in a range of 13~16 μm.

In some examples, a minimum distance between the anode electrodes of the two first sub-pixels in the first sub-pixel pair is in a range of 8~15 μm.

An example of the present disclosure is a pixel arrangement structure, comprising a plurality of repeating units, wherein each of the plurality of repeating units comprises two first sub-pixels, one second sub-pixel, and one third sub-pixel; in each of the plurality of repeating units, the two first sub-pixels form a first sub-pixel pair; the one second sub-pixel, the first sub-pixel pair, and the one third sub-pixel are arranged in a first direction; and the two first sub-pixels in the first sub-pixel pair are arranged in a second direction intersecting the first direction; the plurality of repeating units are arranged in the first direction to form a plurality of repeating unit groups, and the plurality of repeating unit groups are arranged in the second direction; the repeating units in adjacent ones of the plurality of repeating unit groups are misaligned with each other in the second direction, and the repeating units in two repeating unit groups which are separated from each other by one repeating unit group are aligned with each other in the second direction, each of the first sub-pixel, the second sub-pixel and the third sub-pixel comprises a pixel defining layer, the pixel defining layer comprises a pixel defining layer opening to define an effective light emitting region of each sub-pixel, a minimum distance between the pixel defining layer opening of the first sub-pixel pair and the pixel defining layer opening of the second sub-pixel is a first distance, a minimum distance between the pixel defining layer opening of the first sub-pixel pair and the pixel defining layer opening of the third sub-pixel is a second distance, a minimum distance between the pixel defining layer opening of the second sub-pixel and the pixel defining layer opening of the third sub-pixel is a third distance, a minimum distance between the pixel defining layer openings of the two first sub-pixels in the first sub-pixel pair is a fourth distance, the first distance, the second distance and the third distance are all greater than the fourth distance.

In some examples, a distance between centers of the two first sub-pixels in each repeating unit is a fifth distance, and a minimum distance along the second direction between centers of two first sub-pixels which are respectively from two adjacent repeating unit groups is sixth distance, and a ratio of the fifth distance to the sixth distance is in a range from 1 to 1.5.

An example of the present disclosure is a display device, comprising: a base substrate; and the pixel arrangement structure as mentioned above formed on the base substrate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
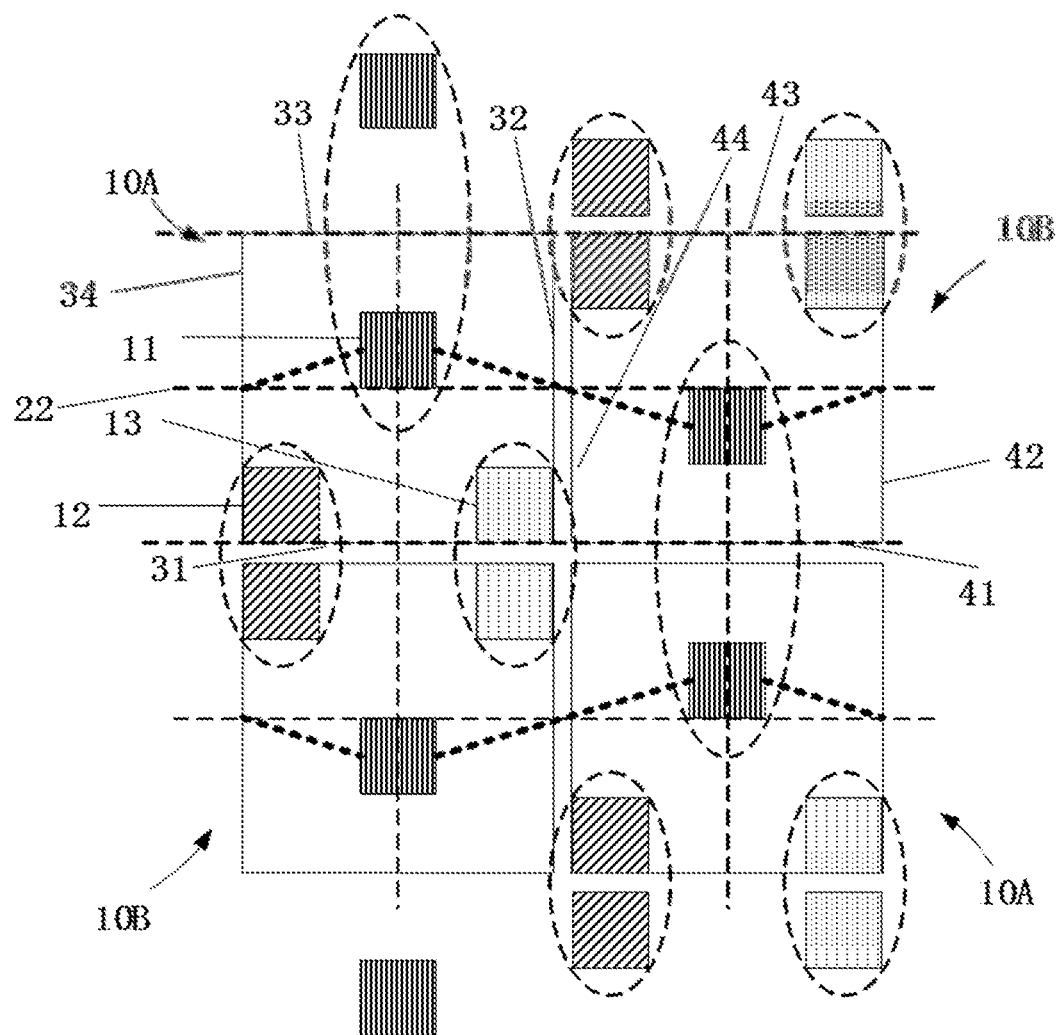
FIG. 1 shows a schematic view of a pixel arrangement structure according to one embodiment.

The present disclosure is described with reference to embodiments of the invention. Throughout the description of the invention reference, is made to FIGS. 1-3. When referring to the figures, like structures and elements shown throughout are indicated with like reference numerals.

Unless otherwise defined, technical terms or scientific terms used herein should be in the ordinary meaning as understood by those of ordinary skill in the art to which this invention belongs. The terms "first," "second," and the like as used in the specification and claims are not intended to imply any order, quantity or importance, but only to distinguish between the different components. Likewise, the terms "a" and the like do not denote a numerical limitation, but rather denote the presence of at least one. The terms "connected" and the like are not limited to physical or mechanical connections, regardless of whether it is direct or indirect. The terms "upper," "lower," "left," "right" and the like are used only to indicate a relative positional relationship. When the absolute position of the described object is changed, the relative positional relationship is also changed accordingly.

FIG. 1 shows a schematic view of a pixel arrangement structure in accordance with some embodiments of the present disclosure. The pixel arrangement structure comprises: a plurality of first pixels 10A and a plurality of second pixels 10B. The first pixel 10A and the second pixel 10B are alternately arranged in a row direction and a column direction. All pixels surrounding a first pixel 10A are second pixels, and all pixels surrounding a second pixel 10B are first pixels. That is, except pixels at the edges, each of the first pixels is surrounded by the second pixels, and each of the second pixels is surrounded by the first pixels. The first pixel has a first side 31, a second side 32, a third side 33 opposite the first side 31, and a fourth side 34 opposite the second side 32. The second pixel has a first side 41, a second side 42, a third side 43 opposite the first side 41, and a fourth side 44 opposite the second side 42. Each of the first pixel 10A and the second pixel 10B includes: a first sub-pixel 11, a second sub-pixel 12, and a third sub-pixel 13.

In one embodiment, the first sub-pixel 11, the second sub-pixel 12, and the third sub-pixel 13 in the first pixel 10A form a triangular distribution. The first sub-pixel 11, the second sub-pixel 12, and the third sub-pixel 13 in the second pixel 10B form an inverted triangular distribution relative to the triangular distribution in the first pixel. The second sub-pixel and the third sub-pixel in each of the first pixel and the second pixel are located on substantially the same row. "Located on substantially the same row" means that an acute angle formed between a line connecting centers of the second sub-pixel and the third sub-pixel and the row direction is smaller than 5 degree.

In one embodiment, the first sub-pixel in the first pixel is at a center region of the first pixel. The first sub-pixel in the second pixel is at a center region of the second pixel. The "center region" means that the center of the first pixel or the second pixel is located at one part of the first sub-pixel of the first pixel or the second pixel respectively.

In one embodiment, the first sub-pixel is a green sub-pixel.

In one embodiment, the second sub-pixel and the third sub-pixel in each of the first pixel and the second pixel are at an edge region of the pixel.

In one embodiment, in the first pixel, an edge of the second sub-pixel 12 and an edge of the third sub-pixel 13 opposite to the first sub-pixel 11 are in close proximity to the first side 31 of the first pixel 10A. "In close proximity to" herein means that a vertical distance from a center of the second sub-pixel to the first side 31 is smaller than a length of a vertical side of the second sub-pixel, and a vertical distance from a center of the third sub-pixel to the first side is smaller than a length of a vertical side of the third sub-pixel.

In the second pixel adjacent to the first pixel in the row direction, an edge of the second sub-pixel 12 and an edge of the third sub-pixel 13 opposite to the first sub-pixel 11 are in close proximity to the third side 43 of the second pixel 10B. "In close proximity to" herein means that a vertical distance from a center of the second sub-pixel to the third side 43 is smaller than a length of a vertical side of the second sub-pixel, and a vertical distance from a center of the third sub-pixel to the third side 43 is smaller than a length of a vertical side of the third sub-pixel.

The first side 31 of the first pixel 10A and the third side 43 of the second pixel 10B are located on two opposite sides of the first sub-pixels of the first pixel 10A and the second pixel 10B respectively. In the first pixel 10A, the first sub-pixel is within a region between the third side 33 and the second and third sub-pixels. In the second pixel, the first sub-pixel is within a region between the first side 41 and the second and third sub-pixels.

In one embodiment, the edge of the second sub-pixel and the edge of the third sub-pixel opposite to the first sub-pixel in the first pixel overlap with the first side 31. The edge of the second sub-pixel and the edge of the third sub-pixel in the second pixel overlap with the third side 43.

In one embodiment, in the first pixel 10A, a vertical distance from a center of the first sub-pixel to the third side 33 is smaller than a vertical distance from the center of the first sub-pixel to the first side 31. In the second pixel, a vertical distance from a center of the first sub-pixel to the first side 41 is smaller than a vertical distance from the center of the first sub-pixel to the third side 43.

In one embodiment, in each of the first pixel and the second pixel, an edge of the first sub-pixel adjacent to the second sub-pixel and the third sub-pixel is in close proximity to a second straight line 22, which is parallel to the row direction and at equal vertical distance to the first side and the third side. "In close proximity to" herein means that a vertical distance from a center of the first sub-pixel to the second straight line 22 is smaller than a length of a vertical side of the first sub-pixel.

In one embodiment, the edge of the first sub-pixel adjacent to the second sub-pixel and the third sub-pixel overlap with the second straight line 22.

In one embodiment, the first sub-pixel, the second sub-pixel, and the third sub-pixel of the same pixel form an isosceles triangle distribution. Each of the first pixel and the second pixel may be a rectangular or square pixel.

In one embodiment, in each of the first pixel and the second pixel, the second sub-pixel and the third sub-pixel are located near two corners of the rectangular or square pixel in the row direction, with two adjacent perpendicular edges of the second sub-pixel and two adjacent perpendicular edges of the third sub-pixel in close proximity to two adjacent perpendicular edges of the rectangular or square pixel, respectively. "In close proximity to" herein means that a vertical distance from a center of a sub-pixel to a side of the pixel is smaller than a length of a perpendicular side of the sub-pixel, which is perpendicular to the side of the pixel, In one embodiment, the two adjacent perpendicular edges of the second sub-pixel and the two adjacent perpendicular edges of the third sub-pixel overlap with the two adjacent perpendicular edges of the rectangular or square pixel, respectively.

In one embodiment, in each of the first pixel and the second pixel, the first sub-pixel is positioned on a perpendicular bisector of the second sub-pixel and the third sub-pixel. In another embodiment, in each of the first pixel and the second pixel, a center of the first sub-pixel is located on the perpendicular bisector of the second sub-pixel and the third sub-pixel.

In one embodiment, the second sub-pixel and third pixel in the first pixel are adjacent to the second sub-pixel and third pixel in the second pixel adjacent to the first pixel in the column direction.

In one embodiment, as shown in FIG. 1, in a row direction, three sub-pixels of different colors are arranged within a spacing of two adjacent pixels of the same row. In the column direction, two sub-pixels of the same color are arranged within a spacing of two adjacent pixels of the same column. Compared with the conventional art, where six sub-pixels are arranged within a spacing of two adjacent pixels in the row direction, and two sub-pixels are arranged within a spacing of two adjacent pixels in the column direction, this embodiment reduces the number of sub-pixels significantly, thereby reducing the difficulty of manufacturing the pixels, and making it possible to produce a display device having a high PPI (e.g., a resolution of 500 ppi or more).

In one embodiment, in the same column, only two sub-pixels of the same color are included, and the two sub-pixels are adjacent to each other (see the two sub-pixels in the same elliptical dashed-line frame in FIG. 1. During the vapor deposition technique to form the sub-pixels in accordance with some embodiments, the number of sub-pixels within the spacing of the same number of pixels is reduced. The two adjacent sub-pixels located in the same elliptical dashed-line frame can be formed by one FMM opening evaporation. Accordingly, the number (density) of the FMM openings can be effectively reduced, thereby breaking through the limitation of the FMM technology for high-resolution AMO-LED, and achieving 300 ppi or higher resolution of AMO-LED.

In one embodiment, the pixels in the pixel arrangement structure are Real (real) pixels. Accordingly, even in the high PPI, the graphical image display is still relatively clear. This is particularly important for some displays of special graphics or images. For example, displays of pointers of electronic display watches and other details show a smooth, sharp feeling.

In one embodiment, as shown in FIG. 1, in the same column, the adjacent first and second pixels 10A and 10B are mirror-symmetric. That is, the arrangement structure of the first sub-pixel 11, the second sub-pixel 12, and the third sub-pixel 13 in the second pixel 10B is mirror-symmetric with that of the first sub-pixel 11, the second sub-pixel 12, and the third sub-pixel in the first pixel 10A.

In one embodiment, in the same column, adjacent first and second pixels 10A and 10B are not mirror-symmetric; for example, the center of the first sub-pixel 11 of the first pixel 10A and the center of the first sub-pixel 11 of the second pixel 10B may not be on the same straight line.

In one embodiment, in the same pixel, the first sub-pixel 11, the second sub-pixel 12, and the third sub-pixel 13 have an isosceles triangle distribution. That is, the lines connecting the centers of the first sub-pixel 11, the second sub-pixel 12, and the third sub-pixel 13 form an isosceles triangle. In another embodiment, the first sub-pixel 11, the second sub-pixel 12, and the third sub-pixel 13 have an equilateral triangle distribution.

In one embodiment, in the column direction, a vertical distance from the first sub-pixel to a line connecting centers of the second sub-pixel or the third sub-pixel in the same pixel is larger than a vertical distance from the same first sub-pixel to a line connecting centers of another second sub-pixel and another third sub-pixel in another adjacent pixel in the row direction.

In one embodiment, in the same pixel, an edge of the first sub-pixel 11, which is parallel to the row direction and adjacent to the second sub-pixel 12 and the third sub-pixel 13, is located on a second straight line 22. In one embodiment, the second straight line 22 is parallel to the first side and located between the first side and the third side. In one embodiment, the distances from the second straight line 22 to the first side and to the third side are the same. The distance between two straight lines generally refers to the vertical distance between the two straight lines.

In one embodiment, the first sub-pixel 11, the second sub-pixel 12, and the third sub-pixel 13 are all rectangular sub-pixels. Based on actual needs of production, these sub-pixels may be formed into other shapes such as a circle, a triangle, a parallelogram, etc., and the present disclosure is not limited thereto.

In one embodiment, the first pixel 10A and the second pixel 10B each is a rectangular pixel. Preferably, the first pixel 10A and the second pixel 10B each is a square pixel, which makes the distribution of the sub-pixels more uniform and improves the quality of display. Based on actual production needs, other shapes such as a circle, a triangle, a parallelogram, and the like may also be made, and the present invention is not limited thereto.

In another embodiment, the first sub-pixel 11 is a sub-pixel having a larger impact on brightness of the pixel, and the second sub-pixel 12 and the third sub-pixel 13 are sub-pixels having a smaller impact on brightness of the pixel. That is, the impact on brightness of the pixel by the first sub-pixel 11 in the pixel is larger than that of the second sub-pixel 12 and the third sub-pixel 13 in the pixel, thereby making the brightness distribution of the pixels more uniform, and improving the display quality of the display device.

In one embodiment, in the same pixel, the second sub-pixel 12 and the third sub-pixel 13 are located at two ends of one side of the rectangular pixel. Preferably, two perpendicular edges of the second sub-pixel 12 and two perpendicular edges of the third sub-pixel 13 are in close proximity to two adjacent perpendicular edges of the pixel. In other embodiments, two perpendicular edges of the second sub-pixel 12 and two perpendicular edges of the third sub-pixel 13 completely overlap to two adjacent perpendicular edges of the pixel. In other embodiments of the present invention, there may be possibility of fine adjustment of the positions of the second sub-pixel 12 or the third sub-pixel 13.

In one embodiment, when the pixel is a rectangular pixel, in the same pixel, the first sub-pixel 11 is positioned on a perpendicular bisector between the second sub-pixel 12 and the third sub-pixel 13. Preferably, a center of the first sub-pixel 11 is located on the perpendicular bisector between the second sub-pixel 12 and the third sub-pixel 13.

In one embodiment, in the first pixel, when the pixel is a rectangular pixel, the vertical distance from a center of the first sub-pixel 11 to the first side is larger than that from the center of the first sub-pixel 11 to the third side (contrast with the first side). In the second pixel adjacent to the first pixel, the distance from a center of the first sub-pixel 11 to the third side is larger than that from the center of first sub-pixel 11 to the first side. Accordingly, the first sub-pixel 11 is more uniformly distributed along the first pixel and the second pixel than the embodiment as shown in FIG. 4.

Figure 4:
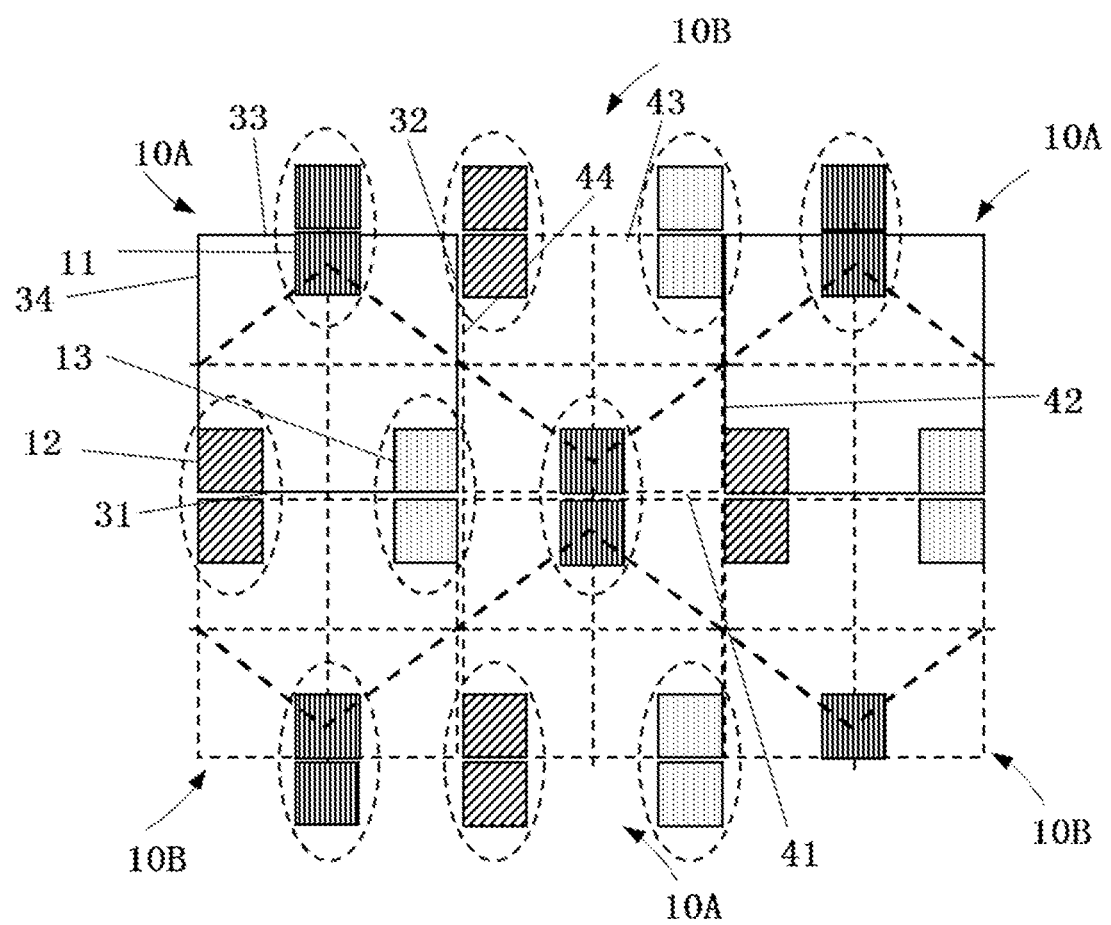
FIG. 4 shows a schematic view of a pixel arrangement structure according to one embodiment.

FIG. 4 shows a schematic view of a pixel arrangement structure in accordance with one embodiment of the present invention. In one embodiment, as shown in FIG. 4, in the first pixel, an edge of the first sub-pixel opposite to the second pixel and the third pixel overlaps with the third side 33. In the second pixel, an edge of the first sub-pixel opposite to the second pixel and the third pixel overlaps with the first side 41.

In one embodiment, in the same pixel, an edge of the first sub-pixel 11, which is parallel and adjacent to the first side, is in close proximity to the perpendicular bisector of the second side of the pixel. In other embodiments of the present invention, the first sub-pixel 11 may be provided at another position, such as other locations between the third side and the perpendicular bisector of the second side of the pixel.

As the human eye is more sensitive to green color, while not too sensitive to red and blue colors, in one embodiment, the first sub-pixel 11 may be a green sub-pixel, the second sub-pixel 12 may be a red sub-pixel or a blue sub-pixel, and the third sub-pixel 13 may be a blue or red sub-pixel. The possibility of using sub-pixels of other colors is not excluded.

Figure 2:
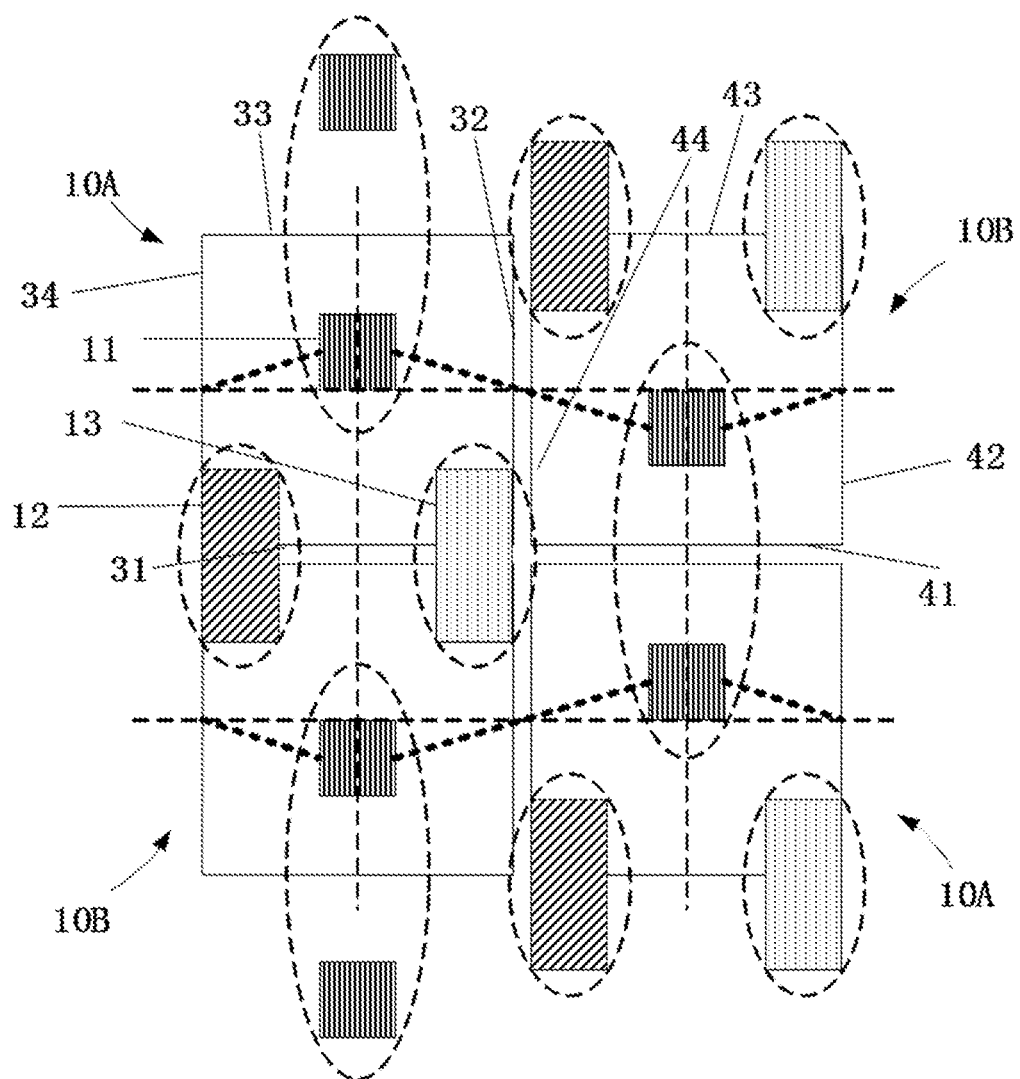
FIG. 2 shows a schematic view of a pixel arrangement structure according to one embodiment.

FIG. 2 shows a schematic view of a pixel arrangement structure in accordance with one embodiment of the present invention. This embodiment differs from the embodiment shown in FIG. 1 in that, in the same column, the second sub-pixels 12 and the third sub-pixels 13 of adjacent first and second pixels 10A and 10B, which are mirror-symmetrical, are integrated, which is then shared by the first pixel 10A and the second pixel 10B through Sup-Pixel Rendering (SPR) algorithm driving. The sharing means that the second sub-pixel 12 in the first pixel 10A and that in the second pixel 10B have a unitary structure. The third sub-pixel 13 in the first pixel 10A and that in the second pixel 10B have a unitary structure. But during display, one of ordinary skill in the art would understand that it is possible to separately control the light emission thereof.

The so-called SPR technology (derived from the virtual pixel reconstruction) refers to, when the display resolution level is equivalent to human eye resolution level, it is possible to utilize the difference in the resolution of the human eye with respect to sub-pixels of different colors to change the conventional model of the pixel (Pixel) simply defined by sub-pixels of three-colors, red, green, and blue (R, G, B). Different pixels also can share some sub-pixels having colors which are insensitive to location resolution. As such, it is possible to use a relatively smaller number of sub-pixels to imitatively achieve the same pixel resolution performance capabilities, thereby reducing the difficulty of processing and the cost.

In one embodiment, the second sub-pixels 12 located in the adjacent first and second pixels 10A and 10B respectively in the same column are integrated. The third sub-pixels 13 located in the adjacent first and second pixels 10A and 10B respectively in the same column are integrated. In another embodiment, only one pair of the first and second sub-pixels 12 or third sub-pixels 13 in the adjacent first and second pixels 10A and 10B are merged into one pixel.

Figure 3:
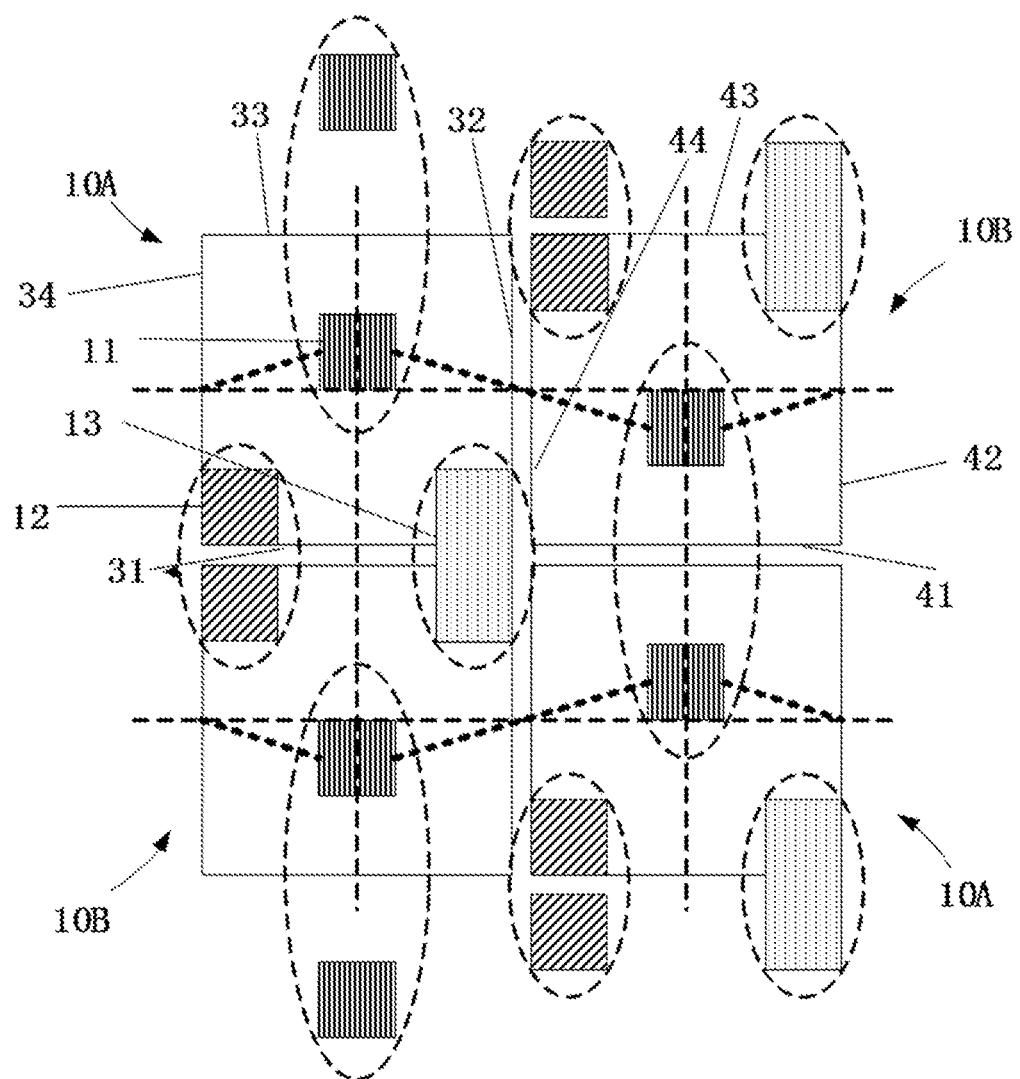
FIG. 3 shows a schematic view of a pixel arrangement structure according to one embodiment.

FIG. 3 shows a schematic view of a pixel arrangement structure in accordance with one embodiment of the present invention. This embodiment differs from the embodiment shown in FIG. 1 in that, in the same column, the third sub-pixels 13 in the adjacent first sub-pixel 10A and the second pixel 10B, which are mirror-symmetrical, in the same column are integrated, driven by the SPR algorithm and shared by the first pixel 10A and the second pixel 10B.

As the human eye is least sensitive to the blue color, it is preferable that the third sub-pixel 13 is a blue sub-pixel.

In another embodiment, the first sub-pixels in the adjacent first pixel and the second pixel in the same column may be shared as well, for example, the two first sub-pixels located in the same elliptical dotted circle in FIG. 3 may be shared.

The embodiment of the present invention also provides a display substrate, including the pixel arrangement structure in any of the above embodiments.

Preferably, the display substrate may be an OLED display substrate.

One embodiment of the present invention also provides a display device including the above-described display substrate.

According to one embodiment of the present invention, a method of manufacturing a display substrate is also provided for producing the display substrate.

In the embodiment, the display substrate is an OLED display substrate, and the manufacturing method may include: forming a sub-pixel of the OLED display substrate by an evaporation deposition technology using an FMM mask plate. The FMM mask plate may include at least one first opening, and the first opening may correspond to at least two adjacent sub-pixels of the same color.

One embodiment of the invention also provides an FMM mask plate, which can be used to form the OLED display substrate. The FMM mask plate includes at least one first opening, and the first opening may correspond to at least two adjacent sub-pixels of the same color.

Figure 5:
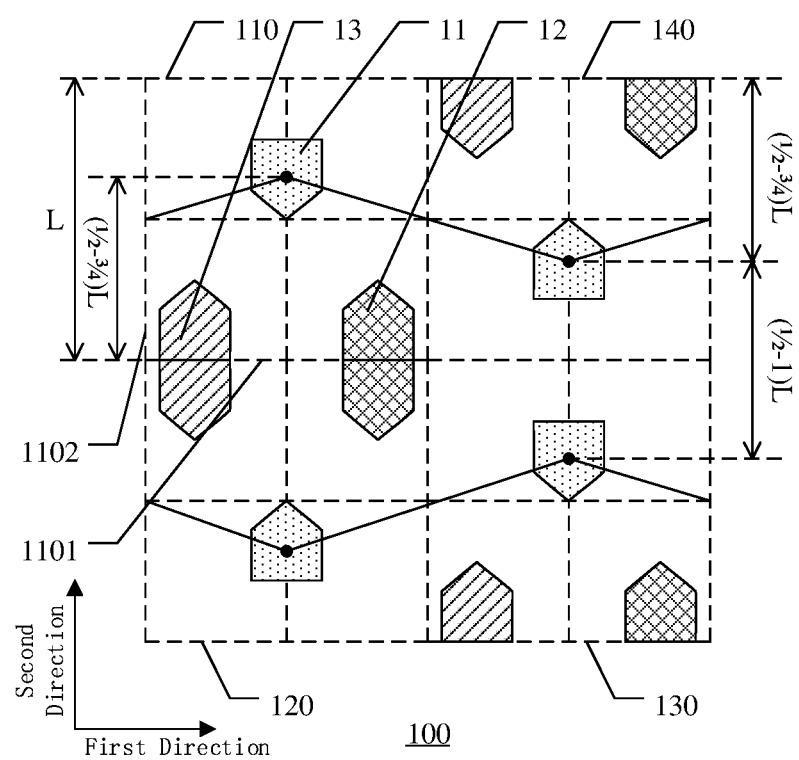
FIG. 5 illustrates a pixel arrangement structure according to some embodiments of the present disclosure.

FIG. 5 illustrates a pixel arrangement structure according to some embodiments of the present disclosure. As described above, the first sub-pixel 11, the second sub-pixel 12 and the third sub-pixel 13 are not limited to rectangular shapes, but may be other shapes. For example, as illustrated in FIG. 5, the first sub-pixel 11 has a shape of pentagon, the second sub-pixel 12 and the third sub-pixel 13 both have a shape of hexagon. For example, the abovementioned shapes can be approximate shapes, for example, the abovementioned shapes can comprise a pentagon with rounded corners, a hexagon with rounded corners, and so on.

As illustrated in FIG. 5, one minimum repeating region 100 in the pixel arrangement structure comprises a first virtual rectangle 110, the first virtual rectangle 110 comprises one first sub-pixel 11, one second sub-pixel 12 and one third sub-pixel 13. The first virtual rectangle 110 comprises a first side 1101 extending in a first direction and a second side 1102 extending in a second direction, the second sub-pixel 12 and the third sub-pixel 13 are distributed on both sides of a perpendicular bisector of the first side 1101, and a distance between the second sub-pixel 12 and the first side 1101 and a distance between the third sub-pixel 13 and the first side 1101 are both smaller than a distance between the first sub-pixel 11 and the first side 1101. That is, the second sub-pixel 12 and the third sub-pixel 13 are closer to the first side 1101 than the first sub-pixel 11. A center of the first sub-pixel 11 is located on the perpendicular bisector of the first side 1101 and a distance between the center of the first sub-pixel 11 and the first side 1101 is ½~¾ of a length of the second side 1102. For example, as illustrated in FIG. 5, the length of the second side 1102 is L, and the distance between the center of the first sub-pixel 11 and the first side 1101 is (½~¾) L. In addition, a structure in a second virtual rectangle 120 can be obtained by mirroring the abovementioned structure located in the first virtual rectangle 110. A structure of a third virtual rectangle 130 can be obtained by translating the structure in the first virtual rectangle 110 in a diagonal direction by a length of a diagonal line of the first virtual rectangle, and a structure of a fourth virtual rectangle can be obtained by mirroring the structure of the third virtual rectangle 130. In addition, in two adjacent virtual rectangles on the right in FIG. 5, a distance between centers of the two first sub-pixels 11 is (½~1) L.

It should be noted that, the abovementioned first virtual rectangle is for better description of a position of the three sub-pixels, not an actual structure. In addition, a range of the abovementioned first virtual rectangle can be greater than a light emitting region of the third sub-pixel, the first sub-pixel, and the second sub-pixel in the first virtual rectangle.

Furthermore, in embodiments of the present disclosure, unless otherwise specified, the "center" of a sub-pixel refers to the geometric center of a shape of the sub-pixel (e.g., the first sub-pixel, the second sub-pixel, or the third sub-pixel); the abovementioned distance between the second (third) sub-pixel and the first side refers to a distance between a center of the second (third) sub-pixel and the first side, the abovementioned distance between the first sub-pixel and the first side refers to a distance between a center of the first sub-pixel and the first side.

As illustrated in FIG. 5, the second sub-pixels 12 located in different virtual rectangles and adjacent to each other are connected as a whole to form one sub-pixel 12 (for example, the second sub-pixel 12 with a shape of hexagon), and the third sub-pixels 13 located in different virtual rectangles and adjacent to each other are connected as a whole to form one sub-pixel 13 (for example, the second sub-pixel 12 with a shape of hexagon). Thus, in the description of the following embodiments, if not specifically explained, the second sub-pixel 12 represents the one sub-pixel 12 which is connected as a whole, and the third sub-pixel 13 represents the one sub-pixel 13 which is connected as a whole. For example, the sub-pixel structure in one virtual rectangle here can be equivalent to the sub-pixel structure in one pixel 10A or 10B in the abovementioned embodiments.

FIG. 5 is only one minimum repeating unit of the pixel arrangement structure according to the embodiments of the present disclosure. In the pixel arrangement structure according to the embodiments of the present disclosure, other parts can be selected as repeating units for the same pixel arrangement structure.

Figure 6:
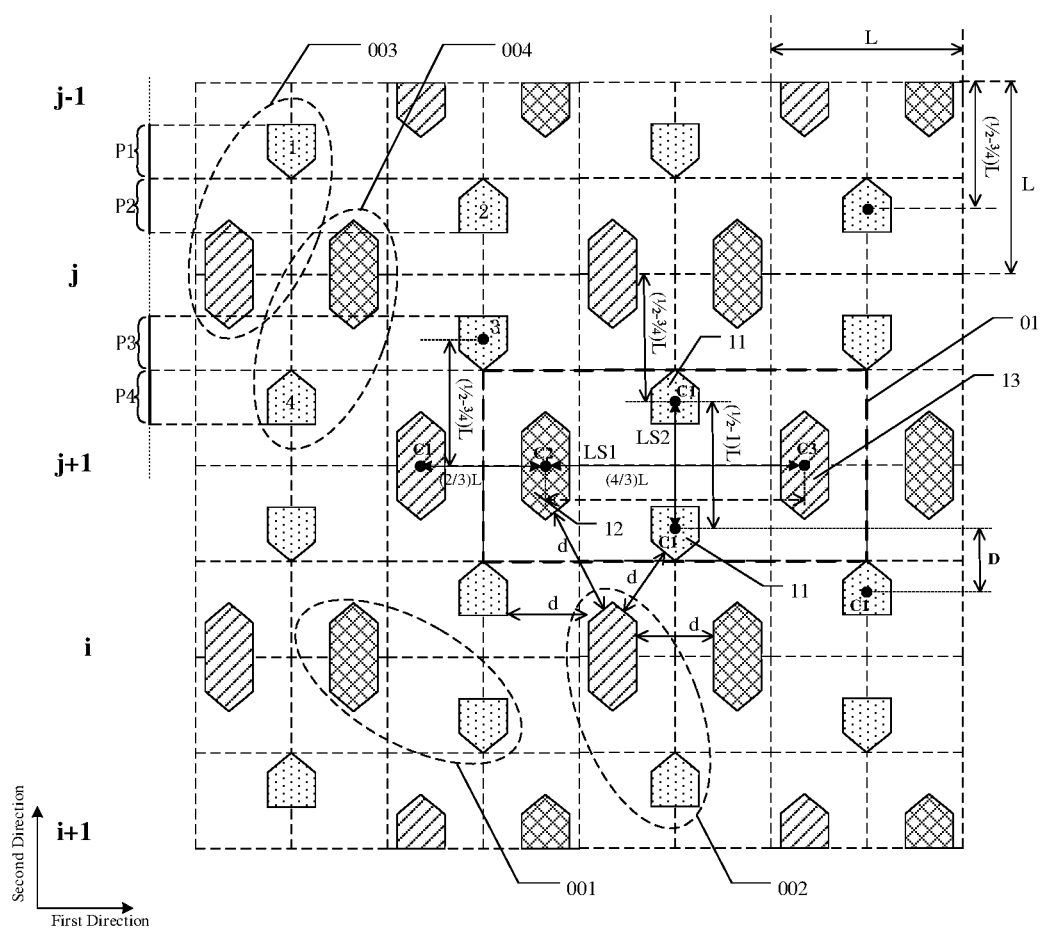
FIG. 6 is a partial plan view illustrating an arrangement of four repeating units according to FIG. 5.

FIG. 6 is a partial plan view illustrating an arrangement of four repeating units according to FIG. 5. As illustrated in FIG. 6, a part indicated by the dashed line box 01 can be selected as a repeating unit. The repeating unit comprises two first sub-pixels 11, one second sub-pixel 12 and one third sub-pixel 13. In each repeating unit, the two first sub-pixels form a first sub-pixel pair; the one second sub-pixel, the first sub-pixel pair, and the one third sub-pixel are arranged in a first direction; and the two first sub-pixels in the first sub-pixel pair are arranged in a second direction intersecting the first direction. The repeating units are sequentially arranged in the first direction to form a plurality of repeating unit groups. In the first direction, a pitch of the repeating units is 2L. The plurality of repeating unit groups are sequentially arranged in the second direction. For example, in some examples, as illustrated in FIG. 6, the repeating units in adjacent repeating unit groups are misaligned with each other in the second direction. For example, the repeating units in adjacent repeating unit groups are shifted by a distance of ½ pitch of the repeating unit in the first direction, that is the distance L. After the above shift, for example, a connection line of centers of the two first sub-pixels in one repeating unit in the one repeating unit group is aligned with a middle point of an interval between two adjacent repeating units in the next repeating unit group in the second direction.

For example, the first direction is perpendicular to the second direction.

Furthermore, as illustrated in FIG. 6, in the repeating unit group 01, a connection line between a center C2 of the second sub-pixel 12 and a center C3 of the third sub-pixel 13 is a first line segment LS1; the two first sub-pixels are located between the third sub-pixel 13 and the second sub-pixel 12, and disposed on both sides of the first line segment LS1. A connection line of the centers of the two first sub-pixels is a second line segment LS2; a length of the second line segment LS2 is less than that of the first line segment LS1. For example, in order to obtain a better effect of the tight arrangement of pixels, a length ratio of the second line segment LS2 and the first line segment LS1 is less than or equal to ¾. For example, the second line segment LS2 and the first line segment LS1 are vertically bisected with each other.

Furthermore, as can be seen from FIG. 6, in one repeating unit, the length of the connection line of the centers of the second sub-pixel and the third sub-pixel is 4L/3; in the same repeating unit group, the length of the connection line of the centers of the second sub-pixel and the third sub-pixel adjacent to each other and respectively located in different repeating units is 2L/3. Thus, it can be seen from the above mentioned description that the pitch of the repeating unit is 2L.

As illustrate by FIG. 6, the minimum distance along the second direction between centers of two first sub-pixels which are respectively from two adjacent repeating unit groups is D. The minimum distance along the second direction herein actually refer to a distance from the center of a first sub-pixel at the lower side in an upper one of two adjacent repeating unit groups to the center of a first sub-pixel at the upper side in an lower one of the two adjacent repeating unit groups measured in the second direction. In some examples, the ratio of the distance between the centers of two first sub-pixels in one repeating unit to the minimum distance D is in a range from 1 to 1.5. With such an arrangement of the first sub-pixels, the distribution of the first sub-pixels is more uniform in different directions. For example, the first sub-pixels are green sub-pixels. Because the green sub-pixels have the greatest impact on the brightness of pixel units, the uniform distribution of the green sub-pixels can improve the evenness of the display of the whole pixel units, so as to avoid or alleviate the problems such as saw-tooth edge and rainbow patterns.

According to FIG. 6, the repeating units in adjacent repeating unit groups are misaligned with each other in the second direction; however, two repeating unit groups separated from each other by one repeating unit group are aligned with each other in the second direction. Thus, a plurality of first sub-pixels in the pixel arrangement structure can be arranged along the second direction to form a plurality of first sub-pixel groups, the first sub-pixels in each first sub-pixel group are aligned with each other in the second direction. For example, the connection line of centers of the first sub-pixels in each first sub-pixel group is parallel to the second direction. Based on the abovementioned arrangement rule, it can be seen that if the repeating unit groups are sequentially numbered, the first sub-pixel pairs in the odd repeating unit groups are aligned with each other, and the first sub-pixel pairs in the even repeating unit groups are aligned with each other. Thus, adjacent first sub-pixel groups respectively comprise the first sub-pixel pairs located in the odd repeating unit groups and the first sub-pixel pairs located in the even repeating unit groups.

In adjacent two first sub-pixel groups, orthographic projections of different first sub-pixels on a straight line in the second direction do not overlap each other. FIG. 6 exemplarily illustrates orthographic projections P1, P2, P3 and P4 of four first sub-pixels labeled 1, 2, 3 and 4 on a straight line in the second direction, in which the first sub-pixels 1 and 4 are located in one first sub-pixel group, and the first sub-pixels 2 and 3 are located in an adjacent first sub-pixel group. As can be seen from FIG. 6, P1, P2, P3 and P4 do not overlap each other. Although P1 and P2 are adjacent to each other, and P3 and P4 are adjacent to each other, all of them do not overlap. Furthermore, the embodiments according to the present disclosure are not limited to a case shown in FIG. 6, P1 and P2 can be spaced apart from each other, and P3 and P4 can also be spaced apart from each other. In a case that orthographic projections of the first sub-pixels in adjacent two groups on the straight line in the second direction do not overlap each other, the distribution of the first sub-pixels in the second direction can be more uniform, so as to be beneficial to the improvement of the image display quality. Furthermore, openings in an evaporation mask required for preparing certain functional layers of the first sub-pixel are also evenly distributed, so as to be beneficial to the design of the evaporation mask and the improvement of the accuracy of the evaporation mask.

Furthermore, as illustrated in FIG. 6, a minimum distance between adjacent sub-pixels (or sub-pixel pairs) is d. For example, in actual manufacturing, the minimum distance d can be as close as possible to the minimum process spacing.

It should be noted that, a shape of an actual fabricated sub-pixel may deviate from the designed sub-pixel shape because of various manufacturing errors. Therefore, in the present disclosure, there may be a certain error about a position of the center of the sub-pixel and a relationship between the positions of the sub-pixel center and other objects. The center of a sub-pixel refers to any point in a region surrounded by specific points on radiation segments each of which is from a geometric center of the sub-pixel to a point on the edge of the sub-pixel, each of the specific points is located on a corresponding radiation segment at location ⅓ of length of the radiant section from the geometric center. The definition of the center of the sub-pixel is applicable to the center of the sub-pixel having the regular shape, and is also applicable to the center of the sub-pixel having the irregular shape. For example, assuming that a line connecting the centers of the sub-pixels or a line passing through the centers of the sub-pixels satisfies other corresponding definitions (for example, the extending direction), the lines may pass through the region enclosed by the above-mentioned specific points of the radiation segments. For example, a center of a sub-pixel is located on a certain line, which means that the line can pass through the region enclosed by the above-mentioned specific points of the radiation segments.

Figure 7:
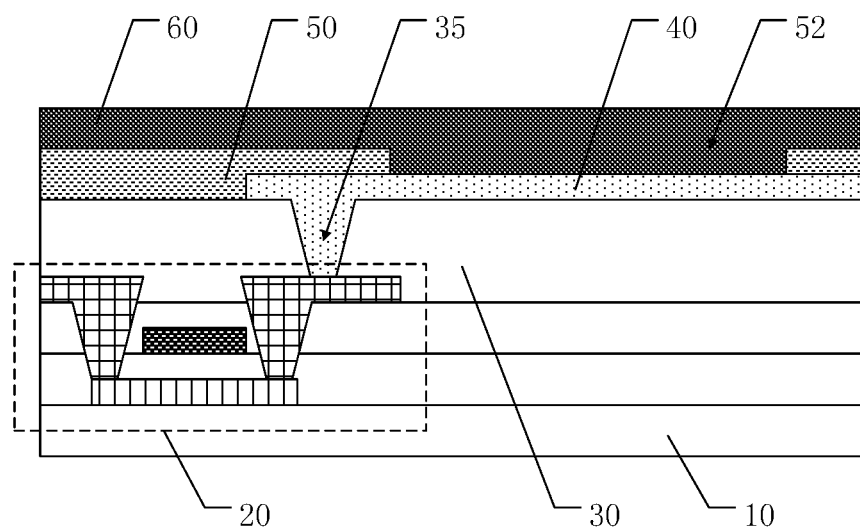
FIG. 7 is a cross-sectional structural view illustrating one sub-pixel region.

FIG. 7 illustrates a cross-sectional structure view of one sub-pixel region. As illustrated in FIG. 7, a pixel driving circuit 20, a planarization layer 30, an anode electrode 40, a pixel defining layer 50 and a light emitting functional layer 60 are sequentially laminated on the base substrate 10. The pixel driving circuit 20 is disposed on the base substrate 10. For the pixel driving circuit, only a thin film transistor is schematically illustrated in the drawing, however, the embodiments of the present disclosure are not limited thereto, the pixel driving circuit 20 can comprise a plurality of thin film transistors or other elements. The planarization layer 30 is disposed on a side of the pixel driving circuit 20 away from the base substrate 10. The anode electrode 40 is disposed on a side of the planarization layer 30 away from the base substrate 10, and is electrically connected with the pixel driving circuit 20 through a via hole 35 in the planarization layer 30. For example, the anode electrode 40 can be electrically connected with a drain electrode of a driving thin film transistor in the pixel driving circuit. The pixel defining layer 50 is disposed on a side of the anode electrode 40 away from the base substrate 10 and is provided with an opening 52, and the opening 52 can expose the anode electrode 40. The light emitting functional layer 60 is disposed on a side of the pixel defining layer 50 away from the base substrate 10. As can be seen from FIG. 7, the light emitting functional layer 60 is in contact with the anode electrode 40 at the opening 52 of the pixel defining layer 50; therefore, the opening region of the pixel defining layer is an effective light emitting region. The shape, the size and the arrangement of each sub-pixel described in the above embodiment is actually the shape, the size and the arrangement of each opening of the pixel defining layer. Furthermore, as can be seen from FIG. 7, a size of the anode electrode in a direction parallel to the base substrate is greater than a size of the opening of the pixel defining layer, and a size of the light emitting functional layer in a direction parallel to the base substrate is greater than the size of the anode electrode.

Figure 8:
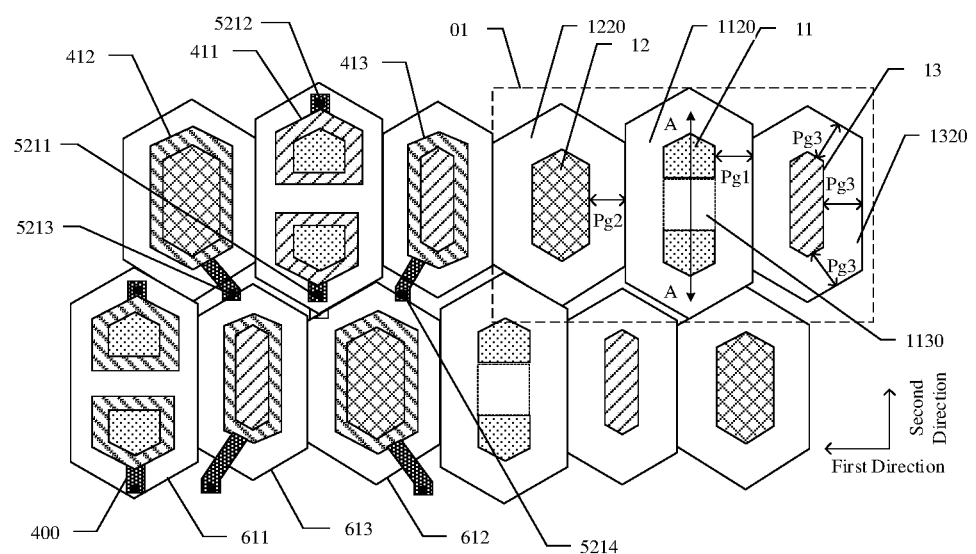
FIG. 8 is a plan structural view of several repeating units respectively arranged in two repeating unit groups.

In order to more clearly describe a shape and size relationship of the pixel defining layer opening, the anode electrode and the light emitting functional layer, a plan structure view is illustrated in FIG. 8 below. FIG. 8 schematically illustrates several repeating units respectively arranged in two repeating unit groups. For clarity of illustration, two second sub-pixels, two third sub-pixels and four first sub-pixels in the left of FIG. 8 schematically illustrate the structures of the pixel defining layer opening, the anode electrode and the light emitting functional layer; and two second sub-pixels, two third sub-pixels and four first sub-pixels in the right of FIG. 8 only illustrate the light emitting functional layer and the pixel defining layer opening. The plan view in FIG. 8 does not show a stacking order of each layer, and the stacking order of each layer can be referred to FIG. 7. As illustrated in FIG. 8, the first sub-pixel comprises the corresponding pixel defining layer opening, the anode electrode 411, and the light emitting functional layer 611; the second sub-pixel comprises the corresponding pixel defining layer opening, the anode electrode 412, and the light emitting functional layer 612; and the third sub-pixel comprises the corresponding pixel defining layer opening, the anode electrode 413 and the light emitting functional layer 613. In each sub-pixel (the first sub-pixel, the second sub-pixel and the third sub-pixel), an area of the light emitting functional layer is the largest, an area of the anode electrode is less than that of the light emitting functional layer, and an area of the pixel defining layer opening is the smallest. An orthographic projection of the pixel defining layer opening on a plane defined by the first direction and the second direction falls within an orthographic projection of the anode electrode on the plane. The orthographic projections of the anode electrodes of the first sub-pixel, the second sub-pixel and the third sub-pixel on the plane falls within orthographic projections of the light emitting functional layers in the corresponding first sub-pixel, the corresponding second sub-pixel and the corresponding third sub-pixel on the plane.

As illustrated in FIG. 8, two opposite edges of the openings of the pixel defining layers of the two first sub-pixels in the first sub-pixel pair extend in the first direction, that is the two opposite edges are parallel to each other, and distances between the two edges are equal at different positions, so that the maximum light emitting area can be ensured.

For example, as shown in FIG. 8, the pixel defining layer openings of any adjacent two of the first sub-pixel, the second sub-pixel and the third sub-pixel have approximately parallel opposite edges, and a perpendicular bisector of one edge of the opposite edges passes through the other edge. In some examples, the length of the connection line of centers of the two opposite edges is the minimum distance between the two opposite edges. At both sides of the centers, the space between the two opposite edges can be gradually increased. For example, the largest space between the two opposite edges can be 1.5 times of the minimum distance between the two opposite edges.

As illustrated in sub-pixels of which the anode electrode is not shown in the right portion of FIG. 8, in each of the second sub-pixel 12 and the third sub-pixel 13, the light emitting functional layer comprises an annular portion 1220 and 1320 located on the pixel defining layer surrounding the corresponding pixel defining layer opening; and in the first sub-pixel pair (the two first sub-pixels 11), the light emitting functional layer 611 comprises an annual portion 1120 located on the pixel defining layer surrounding the corresponding pixel defining layer opening of the two first sub-pixels and a connection portion 1130 (see the dotted line frame between the two first sub-pixels in FIG. 8) located on the pixel defining layer between the two pixel defining layer openings. In each of the first sub-pixel pair, the second sub-pixel and the third sub-pixel, the annular portion of the light emitting functional layer has an equal width (i.e., Pg1, Pg2 and Pg3) at different location. For example, the width Pg1 is equal to the width Pg2 and the width Pg3, respectively.

Figure 9:
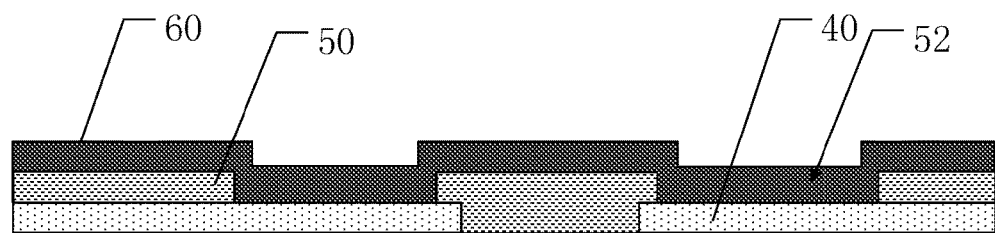
FIG. 9 is a partial cross-sectional view taken along line AA of FIG. 8.

Furthermore, it should be noted that, in one repeating unit, the two first sub-pixels 11 form a sub-pixel pair, and the light emitting functional layers of the two first sub-pixels 11 can be formed by one mask opening. In a case that the light emitting functional layers of the two first sub-pixels 11 are formed by one opening, the difficulty in manufacturing FMM is reduced, and the manufacturing efficiency is improved. In this case, at least the annular portion and the connection portion of the light emitting functional layer of the first sub-pixel pair are a continuous layer structure. As shown in FIG. 8, the annular portion 1120 and the connection portion 1130 of the light emitting functional layer of the first sub-pixel pair can have a planar shape of "θ". FIG. 9 is a partial cross-sectional view taken along line AA of FIG. 8, which only illustrates a part of structures such as the anode electrode 40, the pixel defining layer 50 and the light emitting functional layer 60. As can be seen from FIG. 9, the light emitting functional layers of the two first sub-pixels are integrally formed, and distributed on the pixel defining layer and in the pixel defining layer opening, and the light emitting functional layer on the pixel defining layer and the light emitting functional layer in the opening of the pixel defining layer are also connected to each other. However, the embodiments according to the present disclosure are not limited thereto, the light emitting functional layer on the pixel defining layer and the light emitting functional layer in the opening of the pixel defining layer can also be disconnected from each other.

Furthermore, as can be seen from FIG. 8 and FIG. 9, the anode electrodes of the two first sub-pixels in the first sub-pixel pair are spaced apart from each other; therefore, the two first sub-pixels can be independently driven.

In addition, as illustrated in FIG. 8, the anode electrode needs to connect to the driving circuit below through a via hole; therefore, an anode via hole 52 need to be provided in the planarization layer (see FIG. 7). In the repeating unit in the upper left corner in FIG. 8, the anode electrode of the lower one first sub-pixel of the first sub-pixel pair is connected to a first anode via hole 5211 through a connection pattern 400, the anode electrode of the second sub-pixel 12 is connected to a third anode via hole 5213 through the connection pattern 400, and the anode electrode of the third sub-pixel 13 is connected to a fourth anode via hole 5214 through the connection pattern 400. The three anode via holes (5211, 5213 and 5214) are substantially in a straight line parallel to the first direction. That is, the three anode via holes are all formed on the lower side of the upper repeating unit group and are arranged in the straight line parallel to the first direction. Furthermore, for the upper one first sub-pixel 11 in the first sub-pixel pair, its anode electrode is connected to a second anode via hole 5212 located above through the connection electrode 400. For example, the connection situation of the upper first sub-pixel of the first sub-pixel pair in the lower left corner in FIG. 8 can be referred to. That is, for each repeating unit group, the anode via holes of the second sub-pixel, the third sub-pixel and one first sub-pixel located on the lower side of the first sub-pixel pair are located on the lower side of the repeating unit group and are located on substantially the same straight line. The anode via hole of one first sub-pixel located on the upper side of the first sub-pixel pair in the repeating unit group is located above the repeating unit group, and is located on the same straight line with the anode via holes of the second sub-pixel and the third sub-pixel of a repeating unit group adjacent to the upper side of the repeating unit group.

For example, as shown in FIG. 8, the space between the anode via hole 5213 and the anode via hole 5214 of the adjacent second and third sub-pixels is larger than the space between the adjacent anode via hole 5211 and anode via hole 5213. In this case, the anode via hole 5212 of the first sub-pixel in the next repeating unit group can be placed between the anode via hole 5213 and the anode via hole 5214.

For example, the anode via holes arranged along one straight line are repeatedly arranged in sequence according to an order of the anode via hole 5211, the anode via hole 5213, the anode via hole 5212 and the anode via hole 5214.

Although the anode electrodes 411, 412, 413 and the connection electrode 400 use different shadow pattern in FIG. 8, the anode electrodes 411, 412, 413 can be integrally formed with the corresponding connection electrodes, respectively, i.e., formed into an integral structure. For example, each of the connection electrodes can be formed simultaneously with the corresponding connection electrode by depositing a conductive layer (e.g., metal layer) and patterning it.

Furthermore, as can be seen from FIG. 8, the connection electrode (connection electrode) 400 of each sub-pixel electrically connected to the anode electrode can overlap with the light emitting functional layer, or can protrude beyond the region of the light emitting functional layer, which can be arbitrarily adjusted according to the position of the via hole.

In some embodiments, the light emitting functional layer 60 can comprise a hole transport layer, a light emitting layer and an electron transport layer, but are not limited thereto. For different sub-pixels, for example, the hole transport layers can have different thicknesses. For example, the hole transport layer of the second sub-pixel has the smallest thickness, the hole transport layer of the third sub-pixel has the largest thickness, and the thickness of the hole transport layer of the first sub-pixel is between the two. For example, different hole transport layers of different sub-pixels can adopt the same material but have different thicknesses; therefore, an entire thin layer of the hole transport layer can be firstly evaporated by using an open mask, and then fine metal mask (FMM) of the third sub-pixel and the first sub-pixel are respectively used for evaporation to reach respective hole transport layer thicknesses. For the light emitting layer, evaporation is respectively performed by using respective evaporation masks to obtain respective light-emitting layers. For the electron transport layer, the open mask can also be used to evaporate. Therefore, in a process of manufacturing a light emitting diode pixel, five FMM evaporation mask processes can be adopted. For example, for some layers of the light emitting functional layer, the layers can be integrally formed for the plurality of sub-pixels, for example, the layers can be evaporated by using the abovementioned open mask. However, in order to clearly describe, the shape and size of the light emitting functional layer described in the present application are all parts of the patterned light emitting functional layer of each sub-pixel or sub-pixel pair formed by FMM.

In some embodiments, a cathode, a lithium fluoride layer, a light extraction layer and a lithium fluoride layer can be further provided above the light emitting functional layer 60. For example, the cathode can be formed by a transparent conductive material such as ITO. The introduction of lithium fluoride can better modify the ITO surface, reduce the formation of the interface defect state, and enhance the stability of the device. The light extraction layer can improve the light extraction efficiency of the light emitting diode.

Furthermore, as can be seen from FIG. 8, in the same repeating unit group, the light emitting functional layers of adjacent sub-pixels in the first direction are adjacent to each other. That is, there can be no space between two adjacent light emitting functional layers in the first direction. For example, in order to ensure that the light emitting functional layer in the pixel defining layer opening manufactured by FMM process is uniform as possible, and considering the process margin, the FMM opening for manufacturing the light emitting functional layer is as large as possible, but the light emitting functional layers of adjacent sub-pixels with different colors is better not to overlap as much as possible to avoid color mixing, thus, the FMM opening can be designed according to a case that the light emitting functional layers of adjacent sub-pixels abut with each other. But in actual process, because of process errors and other reasons, a shadow region of layers formed by FMM may have certain overlap or spacing, the formed light emitting functional layers of adjacent sub-pixels may have overlapping parts with each other. However, through process control, the size of the overlapping parts can be smaller than $\frac{1}{10}$ or even smaller than $\frac{1}{20}$ of the size of the light emitting functional layer. In addition, as described above, the edge of the pixel defining layer opening of each pixel has an equal distance with the edge of the light emitting functional layer, for example, Pg1=Pg2=Pg3. Therefore, in the first direction, a boundary line of the light emitting functional layers of adjacent two sub-pixels is located in the middle of the interval between the pixel defining layer openings of the adjacent two sub-pixels. In this case, the shape of the light emitting functional layer of each sub-pixel can be calculated. For example, the area of the light emitting functional layer of the first sub-pixel pair is greater than the area of the light emitting functional layer of the second sub-pixel, and the area of the light emitting functional layer of the second sub-pixel is greater than the area of the light emitting functional layer of the third sub-pixel. For example, the first sub-pixel is a green sub-pixel, the second sub-pixel is a blue sub-pixel, and the third sub-pixel is a red sub-pixel. In addition, the light emitting functional layers of the first sub-pixel pair and the second sub-pixel adjacent in the second direction abut with each other, the light emitting functional layers of the third sub-pixel and the first sub-pixel pair adjacent in the second direction are spaced apart from each other, and the light emitting functional layers of the third sub-pixel and the second sub-pixel adjacent in the second direction are spaced apart from each other. In addition, as can be seen from FIG. 8, the interval between the light emitting functional layers of the third sub-pixel and the second sub-pixel adjacent in the second direction is greater than the interval between the light emitting functional layers of the third sub-pixel and the first sub-pixel pair adjacent in the second direction. In the second direction, the size of the light emitting functional layer of one first sub-pixel pair is greater than the size of the light emitting functional layer of one second sub-pixel and greater than the size of the light emitting functional layer of one third sub-pixel; in the first direction, both of the size of the light emitting functional layer of one first sub-pixel pair and the size of the light emitting functional layer of one second sub-pixel are greater than the size of the light emitting functional layer of one third sub-pixel. For the shape and area of the light emitting functional layer designed according to the above rules, the process can be simplified and light emitting area can be maximized.

For example, as illustrated in FIG. 8, a minimum distance between the pixel defining layer openings of the two first sub-pixels of the first sub-pixel pair is smaller than a minimum distance between any two of the pixel defining layer opening of the first sub-pixel pair, the pixel defining layer opening of the second sub-pixel and the pixel defining layer opening of the third sub-pixel. For example, a minimum distance between the pixel defining layer opening of the first sub-pixel pair and the pixel defining layer opening of the second sub-pixel is a first distance, a minimum distance between the pixel defining layer opening of the first sub-pixel pair and the pixel defining layer opening of the third sub-pixel is a second distance, a minimum distance between the pixel defining layer opening of the second sub-pixel and the pixel defining layer opening of the third sub-pixel is a third distance, a minimum distance between the pixel defining layer openings of the two first sub-pixels in the first sub-pixel pair is a fourth distance, the first distance, the second distance and the third distance are all greater than the fourth distance. For example, a difference between the first distance and the second distance is less than 20% of the first distance, and the difference between the first distance and the third distance is less than 20% of the first distance. In a case of full high definition (FHD) resolution, a distance between the pixel defining layer openings of adjacent sub-pixels can be 22~25 µm; in a case of a quarter full definition (QHD) resolution, a distance between the pixel defining layer openings of adjacent sub-pixels can be 19.7~21.5 µm. For example, the abovementioned distance can be in a range of 18~26 µm. The distance between the adjacent sub-pixels as mentioned above refer to a distance between sub-pixels of different colors. For the two sub-pixels in the first sub-pixel pair, the distance between the pixel defining layer openings can be 15 µm in the case of full high definition (FHD) resolution, and 14 µm in the case of a quarter full definition (QHD) resolution. For example, the distance between the pixel defining layer openings of the two first sub-pixels can be in the range of 13~16 µm. Furthermore, for the size of the pixel defining layer opening of each sub-pixel, the minimum size is 8 µm. That is, the size of the pixel defining layer openings of each sub-pixel is greater than or equal to 8 µm.

For the pixel defining layer openings of sub-pixels having different colors, the area of the pixel defining layer opening of the second sub-pixel is the maximum, the area of the pixel defining layer opening of the first sub-pixel is the minimum, and the area of the pixel defining layer opening of the third sub-pixel is between the two. Here, the first sub-pixel is the green sub-pixel, the second sub-pixel is the blue sub-pixel, and the third sub-pixel is the red sub-pixel.

In addition, for example, the minimum distance between the anode electrodes of the two first sub-pixel in the first sub-pixel pair can be in the range of 8~15 µm. In this case, a wire having a line width of about 5 µm can be disposed between the anode electrodes of the two first sub-pixels.

The design structure of the abovementioned light emitting functional layer and the pixel defining layer opening can take into consideration the display effect of sub-pixels of various colors, and realize the most compact arrangement.

Figure 10:
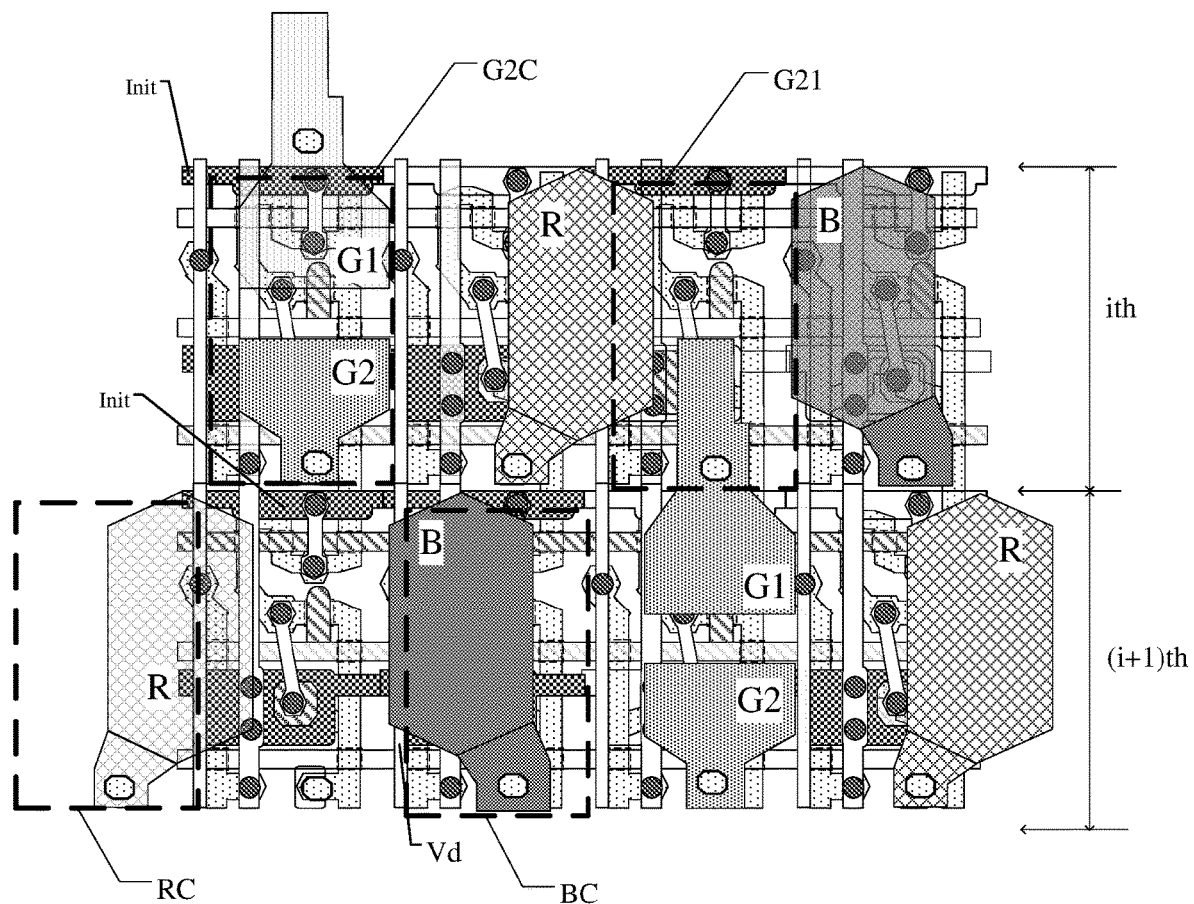
FIG. 10 is a layout view of a pixel arrangement structure provided by some embodiments of the present disclosure.

FIG. 10 is a layout view of a pixel arrangement structure provided by some embodiments of the present disclosure, and FIG. 10 schematically illustrate partial plan structure of two repeating groups (the ith and the (i+1)th, i is an integer). As illustrated in FIG. 10, reset power signal lines Init and data lines Vd cross each other to define a plurality of sub-pixel circuit regions. In each sub-pixel circuit region, one sub-pixel circuit for controlling one sub-pixel to perform light emitting display is provided. In a case where the reset power signal lines and the data lines are perpendicular to each other, each sub-pixel circuit region has an approximately rectangular shape. Each sub-pixel circuit occupies approximately the same area. In addition, each sub-pixel circuit may have approximately the same structure. The sub-pixel circuit herein refers to a part below the anode electrode, for example, including an active layer, a gate layer, a source and drain metal layer and insulating layers therebetween and so on. The patterns corresponding to each sub-pixel circuit can be located in the same layer, and have the same shape, size and relative position, so that the process of manufacturing the pixel circuit can be simple.

Figure 11:
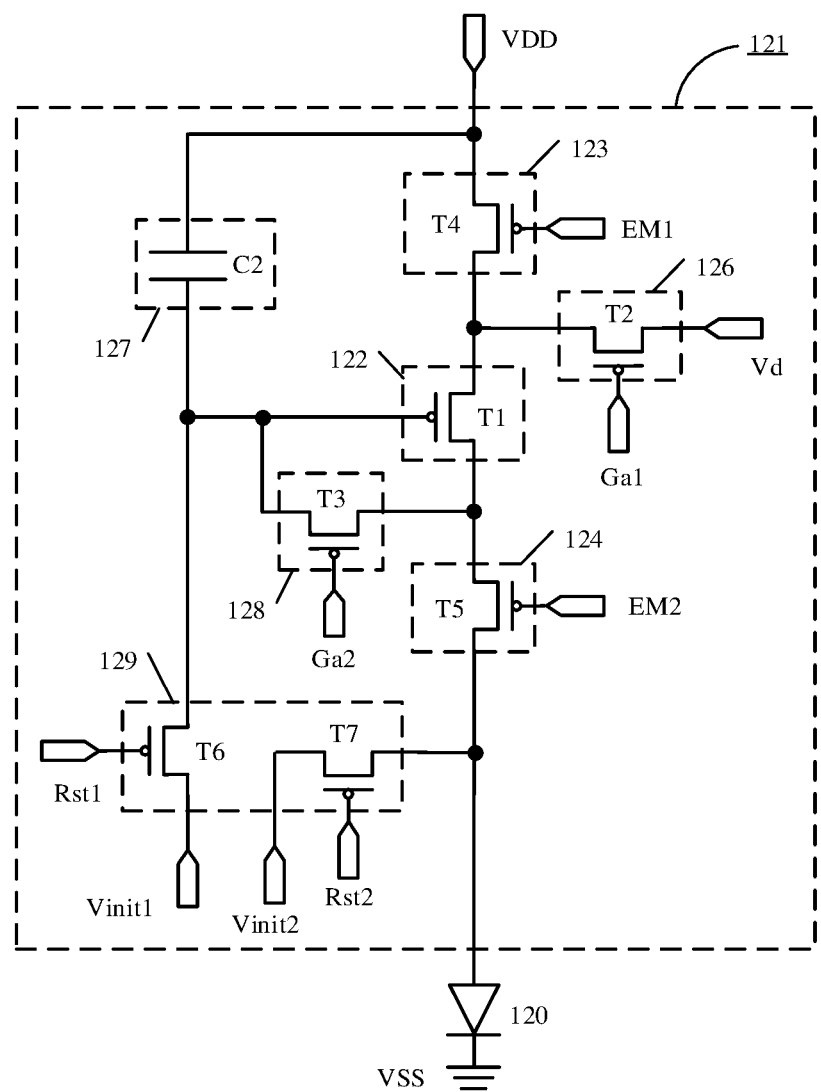
FIG. 11 is a circuit diagram of a sub-pixel circuit according to an embodiment of the present disclosure.

FIG. 11 is a circuit diagram of a sub-pixel circuit according to an embodiment of the present disclosure. As illustrated in FIG. 11, the pixel circuit 121 comprises a first light emitting control circuit 123 and a second light emitting control circuit 124. The driving circuit 122 comprises a control terminal, a first terminal and a second terminal, and is configured to provide a driving current for the light emitting diode to emit light. For example, the first light emitting control circuit 123 is connected to the first terminal of the driving circuit 122 and the first voltage terminal VDD, and is configured to realize on-state or off-state between the driving circuit 122 and the first voltage terminal VDD; the second light emitting control circuit 124 is electrically connected with the second terminal of the driving circuit 122 and a first light emitting voltage applying electrode (e.g., the above mentioned anode electrode) of a light emitting element 120, and is configured to realize on-state or off-state between the driving circuit 122 and the light emitting element 120. The pixel circuit 121 further comprises a data writing circuit 126, a storage circuit 127, a threshold compensation circuit 128 and a reset circuit 129. The data writing circuit 126 is electrically connected to the first terminal of the driving circuit 122, and is configured to write a data signal to the storage circuit 127 under the control of a scan signal; the storage circuit 127 is electrically connected with the control terminal of the driving circuit 122 and the first voltage terminal VDD, and is configured to store the date signal; the threshold compensation circuit 128 is electrically connected with the control terminal and the second terminal of the driving circuit 122, and is configured to perform threshold compensation on the driving circuit 122; the reset circuit 129 is electrically connected with the control terminal of the driving circuit 122 and the first light emitting voltage applying electrode of the light emitting element 120, and is configured to reset the control terminal of the driving circuit 122 and the first light emitting voltage applying electrode of the light emitting element 120 under the control of a reset control signal.

For example, the abovementioned reset power signal line Init can be connected to a rest power terminal Vinit 1 or Vinit 2 of the reset circuit 129, and the data line Vd is connected with one terminal of the data writing circuit 126.

As illustrated in FIG. 10, for the green sub-pixel G2 (first sub-pixel), its sub-pixel circuit is located at a position illustrated by a dashed line box G2C; for the red sub-pixel R (third sub-pixel), its sub-pixel circuit is located at a position illustrated by a dashed line box RC; for the blue sub-pixel B (second sub-pixel), its sub-pixel circuit is located at a position illustrated by a dashed line box BC; and for the green sub-pixel G1 (first sub-pixel), its sub-pixel circuit is located at a position illustrated by a dashed line box G1C. It should be noted that, FIG. 10 only illustrates the positions of the sub-pixel circuits corresponding to the four sub-pixels by the dashed line boxes, while positions of sub-pixel circuits of other sub-pixels can refer to the four sub-pixels. The plurality of sub-pixel circuits are closely arranged in the sub-pixel circuit regions defined by the reset power signal lines and the data lines on the base substrate to make full use of the space. In addition, G1, G2, R and B illustrated in FIG. 10 can be anode electrodes of the first sub-pixel pair, the second sub-pixel and the third sub-pixel, respectively.

Figure 12:
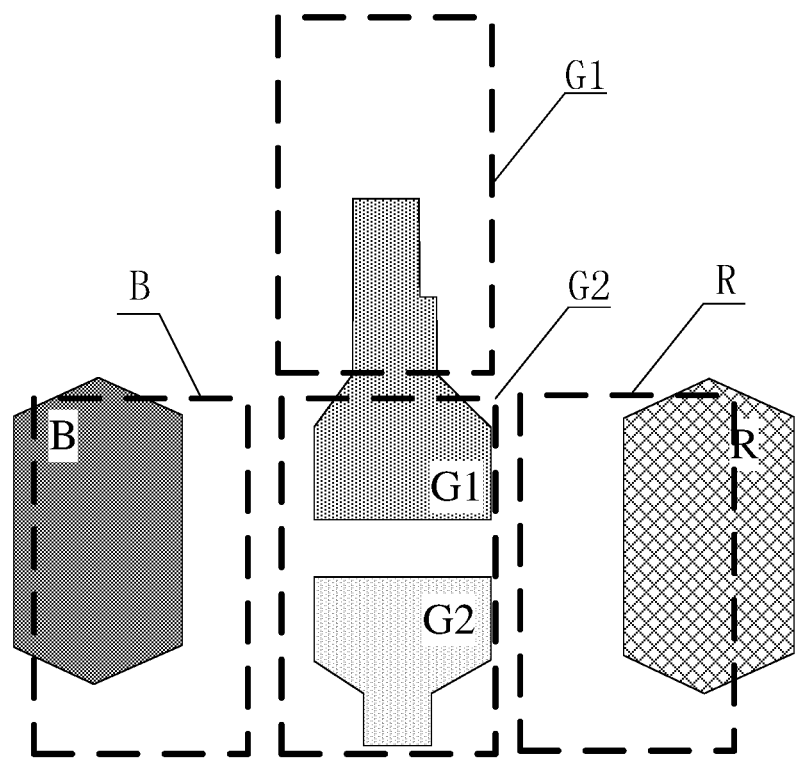
FIG. 12 is a schematic diagram illustrating a position relationship between the anode electrode and a corresponding sub-pixel circuit of each sub-pixel in one repeating unit.

In order to more clearly explain the relationship between the sub-pixel circuit and an anode electrode position of each sub-pixel, description will be made with reference to FIG. 12. FIG. 12 only illustrates a positional relationship between the anode electrode of each sub-pixel and the corresponding sub-pixel circuit in one repeating unit. In the repeating unit, the display of two virtual pixels can be relazed by sub-pixel rendering (SPR). For example, one green sub-pixel located at the upper side can form one virtual pixel with one blue sub-pixel and one red sub-pixel, and one green sub-pixel located at the lower side can form another virtual pixel with the one blue sub-pixel and the one red sub-pixel. Therefore, one repeating unit can comprise two virtual pixels.

That is, in the repeating unit consisting of two first sub-pixels (one first sub-pixel pair), one second sub-pixel and one third sub-pixel, sub-pixels in the repeating unit are arranged in the first direction according to an order of the second sub-pixel, the first sub-pixel pair and the third sub-pixel, and the first sub-pixels in the first sub-pixel pair are arranged in the second direction. For the repeating unit, the sub-pixel circuit of the second sub-pixel at least partially overlaps the anode electrode of the second sub-pixel, the sub-pixel circuit of the third sub-pixel at least partially overlaps the anode electrode of the third sub-pixel, the sub-pixel circuit of one first sub-pixel in the sub-pixel pair is located between the sub-pixel circuits of the second sub-pixel and the third sub-pixel, and overlaps the anode electrodes of the sub-pixel pair; the sub-pixel circuit of another first sub-pixel in the sub-pixel pair is located between a second sub-pixel circuit and a third sub-pixel circuit in another repeating unit group adjacent to the first sub-pixel pair. As seen from FIG. 12, the sub-pixel circuits of one repeating unit generally form a T-shape as a whole.

It should be noted that, the above division of the repeating units and the composition of virtual pixels are merely exemplary, and different virtual pixels can be formed by other sub-pixel combinations through other sub-pixel redering manners. For example, one second sub-pixel and one first sub-pixel in the same repeating unit form a virtual pixel, and one third sub-pixel in the repeating unit and one first sub-pixel adjacent to the one third sub-pixel in another repeating unit group form another virtual pixel, and one first sub-pixel corresponds to one virtual pixel. Alternatively, one third sub-pixel and one first sub-pixel in the same repeating unit form a virtual pixel, and one second sub-pixel in the repeating unit and one first sub-pixel adjacent to the one third sub-pixel in another repeating unit group form another virtual pixel; and one first sub-pixel corresponds to one virtual pixel.

For example, as shown in FIG. 6, two pairs of sub-pixels circled by the dashed lines form a first virtual pixel 001 and a second virtual pixel 002. For example, if the repeating unit group where the second sub-pixel and the third second sub-pixel circled by the dashed lines are located is considered as the ith repeating unit group, then the next adjacent repeating unit group can be considered as the (i+1)th repeating unit group. The first virtual pixel 001 comprises two sub-pixels from the same repeating unit, but the first sub-pixel in the second virtual pixel 002 is from the (i+1)th repeating unit group. That is to say, one first virtual pixel 001 comprising one first sub-pixel and one second sub-pixel, and one second virtual pixel 002 comprising one first sub-pixel and one third sub-pixel. The plurality of repeating unit groups arranged in the second direction are allocated a serial number of i sequentially, one second sub-pixel and one first sub-pixel in the first sub-pixel pair in one repeating unit in the ith repeating unit group form the first virtual pixel 001, the one first sub-pixel is one of the first sub-pixel pair adjacent to the (i+1)th repeating unit group, one third sub-pixel in the one repeating unit in the ith repeating unit group and one first sub-pixel located in the (i+1)th repeating unit group and adjacent to the one third sub-pixel form the second virtual pixel 002, i is positive integers.

In some other embodiments, the virtual pixels can be arranged in other manners. For example, as shown in FIG. 6, the plurality of repeating unit groups arranged in the second direction are allocated with a serial number of j sequentially, one second sub-pixel in the jth repeating unit group and one first sub-pixel which is adjacent to the one second sub-pixel and from the (j–i)th repeating unit group form the third virtual pixel 003, and one third sub-pixel the jth repeating unit group and one first sub-pixel which is adjacent to the one third sub-pixel and from the (j+i)th repeating unit group form the fourth virtual pixel 004, j is positive integers, j is positive integers.

Although the first/second virtual pixels and the third/fourth virtual pixels are shown in the same figure, this is just for simple drawing. In the whole pixel arrangement structure, it is possible to only include the first/second virtual pixels or only include the third/fourth virtual pixels.

The above mentioned virtual pixels refers to the minimum unit to be allocated with various color displaying signals such as red, green and blue, and can be the minimum pixel unit for displaying. A plurality of pixel units are arranged in an array to display an image. For example, an image resolution of resolution of 1024×768 means pixel units of 768 rows and 1024 columns. Since each virtual pixel may lack some sub-pixel emitting light with a certain color, the sub-pixel with the certain color may be borrowed from other virtual pixel by sub-pixel rendering (SPR) technology. In addition, because the virtual pixel incudes less sub-pixels, the pixel arrangement structure can be divided into more virtual pixels so as to increase the image resolution.

An embodiment of the disclosure further provides a display device comprising: a base substrate; and the pixel arrangement structure according to any embodiment mentioned above formed on the base substrate. For example, the base substrate can be the base substrate 10 in FIG. 7.

The descriptions of the various embodiments of the present invention have been presented for purposes of illustration, but are not intended to be exhaustive and the limitation is not limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A pixel arrangement structure, comprising a plurality of repeating units, wherein
    at least one of the plurality of repeating units comprises two first sub-pixels, one second sub-pixel, and one third sub-pixel;
    in at least one of the plurality of repeating units, the two first sub-pixels form a first sub-pixel pair; the one second sub-pixel, the first sub-pixel pair, and the one third sub-pixel are arranged in a first direction; and the two first sub-pixels in the first sub-pixel pair are arranged in a second direction intersecting the first direction;
    the plurality of repeating units are arranged in the first direction to form a plurality of repeating unit groups, and the plurality of repeating unit groups are arranged in the second direction;
    the repeating units in adjacent ones of the plurality of repeating unit groups are misaligned with each other in the second direction, and the repeating units in two repeating unit groups separated from each other by one repeating unit group are aligned with each other in the second direction,
    at least one of the first sub-pixel, the second sub-pixel and the third sub-pixel comprises a pixel defining layer, the pixel defining layer comprises a pixel defining layer opening to define an effective light emitting region of each sub-pixel; a plurality of first sub-pixels are arranged along the second direction to form a plurality of first sub-pixel groups, orthographic projections of pixel defining layer openings of the first sub-pixels in adjacent ones of the plurality of first sub-pixel groups on a straight line parallel to the second direction do not overlap each other.

2. The pixel arrangement structure according to claim 1, wherein at least one of the first sub-pixel, the second sub-pixel and the third sub-pixel further comprises an anode electrode, an orthographic projection of the pixel defining layer opening on a plane defined by the first direction and the second direction falls within an orthographic projection of the anode electrode on the plane.

3. The pixel arrangement structure according to claim 2, wherein at least one of the first sub-pixel, the second sub-pixel and the third sub-pixel further comprises a light emitting functional layer, the orthographic projection of the anode electrode on the plane falls within an orthographic projection of the light emitting functional layer on the plane, at least one of the first sub-pixel, the second sub-pixel and the third sub-pixel further comprises a connection electrode; in each of the first sub-pixel, the second sub-pixel and the third sub-pixel, the connection electrode is electrically connected with the anode electrode, and the connection electrode at least partially overlaps with the light emitting functional layer.

4. The pixel arrangement structure according to claim 3, wherein, in at least one of the second sub-pixel and the third sub-pixel, the light emitting functional layer comprises an annular portion on the pixel defining layer surrounding the pixel defining layer opening; the light emitting functional layer of the first sub-pixel pair comprises an annular portion on the pixel defining layer surrounding the pixel defining layer openings of both of the two first sub-pixels and a connection portion on the pixel defining layer between the pixel defining layer openings of the two first sub-pixels; in each of the first sub-pixel pair, the second sub-pixel and the third sub-pixel, the annular portion of the light emitting functional layer has an equal width at each position.

5. The pixel arrangement structure according to claim 4, wherein at least the annular portion and the connection portion of the light emitting functional layer of the first sub-pixel pair are configured to be a continuous layer structure.

6. The pixel arrangement structure according to claim 5, wherein, for the light emitting layer of the first sub-pixel pair, the light emitting layer of the second sub-pixel and the light emitting layer of the third sub-pixel, any two adjacent light emitting layers of the three light emitting layers in the first direction abut with each other.

7. The pixel arrangement structure according to claim 4, wherein an area of the light emitting functional layer of one first sub-pixel pair as a whole is greater than an area of the light emitting functional layer of one second sub-pixel, the area of the light emitting functional layer of the one second sub-pixel is greater than an area of the light emitting functional layer of one third sub-pixel, the first sub-pixel is a green sub-pixel, the second sub-pixel is a blue sub-pixel, and the third sub-pixel is a red sub-pixel.

8. The pixel arrangement structure according to claim 7, wherein the light emitting functional layers of the first sub-pixel pair and the second sub-pixel adjacent to each other in the second direction abut with each other, the light emitting functional layers of the third sub-pixel and the first sub-pixel pair adjacent to each other in the second direction are spaced apart from each other, the light emitting functional layers of the third sub-pixel and the second sub-pixel adjacent to each other in the second direction are spaced apart from each other, and the interval between the light emitting functional layers of the third sub-pixel and the second sub-pixel adjacent to each other in the second direction is greater than the interval of the light emitting functional layers of the third sub-pixel and the first sub-pixel pair adjacent to each other in the second direction.

9. The pixel arrangement structure according to claim 3, wherein
    at least one of the first sub-pixel, the second sub-pixel and the third sub-pixel comprises a sub-pixel circuit for driving, the sub-pixel circuit is disposed on a side of the anode electrode away from the light emitting functional layer, the anode electrode is connected to the sub-pixel circuit through the connection electrode,
    the pixel arrangement structure further comprises: a plurality of reset power signal lines extending in the first direction and a plurality of data lines extending in the second direction, the plurality of reset power signal lines and the plurality of data lines cross each other to define a plurality of sub-circuit regions, the sub-pixel circuits in respective sub-pixels of the plurality of repeating units are disposed in the plurality of sub-circuit regions.

10. The pixel arrangement structure according to claim 9, wherein, in one repeating unit, the sub-pixel circuit of the second sub-pixel at least partially overlaps the anode electrode of the second sub-pixel, the sub-pixel circuit of the third sub-pixel at least partially overlaps the anode electrode of the third sub-pixel, the sub-pixel circuit of one first sub-pixel of the first sub-pixel pair is located between the sub-pixel circuits of the second sub-pixel and the third sub-pixel, and partially overlaps two anode electrodes of the first sub-pixel pair, the sub-pixel circuit of the other first sub-pixel of the first sub-pixel pair is located between the sub-pixel circuits of one second sub-pixel and one third sub-pixel in another repeating unit group adjacent to the other first sub-pixel, and the sub-pixel circuits of the two first sub-pixels in the first sub-pixel pair are arranged in the second direction.

11. The pixel arrangement structure according to claim 1, comprising a first virtual pixel and a second virtual pixel, one first virtual pixel comprising one of the first sub-pixel and one of the second sub-pixel, and one second virtual pixel comprising one of the first sub-pixel and one of the third sub-pixel,
wherein the plurality of repeating unit groups arranged in the second direction are allocated a serial number of i sequentially, one second sub-pixel and one first sub-pixel in the first sub-pixel pair in one repeating unit in the ith repeating unit group form the first virtual pixel, the one first sub-pixel is one of the first sub-pixel pair adjacent to the (i+1)th repeating unit group, one third sub-pixel in the one repeating unit in the ith repeating unit group and one first sub-pixel located in the (i+1)th repeating unit group and adjacent to the one third sub-pixel form the second virtual pixel, i is positive integers.

12. The pixel arrangement according to claim 1, comprising a third virtual pixel and a fourth virtual pixel, one third virtual pixel comprising one of the first sub-pixel and one of the second sub-pixel, and one fourth virtual pixel comprising one of the first sub-pixel and one of the third sub-pixel,
wherein the plurality of repeating unit groups arranged in the second direction are allocated a serial number of j sequentially, one second sub-pixel in one repeating unit in the jth repeating unit group and one first sub-pixel which is adjacent to the one second sub-pixel and from the (j−i)th repeating unit group form the third virtual pixel, and one third sub-pixel in the one repeating unit the jth repeating unit group and one first sub-pixel which is adjacent to the one third sub-pixel and from the (j+i)th repeating unit group form the fourth virtual pixel, j is positive integers.

13. The pixel arrangement structure according to claim 9, wherein
the first sub-pixel on a lower side of the first sub-pixel pair in the second direction comprises a first via hole, the first sub-pixel on an upper side of the first sub-pixel pair in the second direction comprises a second via hole, the first via hole is located on a side of the pixel defining layer opening of the first sub-pixel away from the second via hole, the second via hole is located on a side of the pixel defining layer opening of the first sub-pixel away from the first via hole, the second sub-pixel comprises a third via hole, the third sub-pixel comprises a fourth via hole, the connection electrodes of the two first sub-pixels of the first sub-pixel pair, the second sub-pixel, and the third sub-pixel are respectively electrically connected to the corresponding sub-pixel circuits through the first via hole, the second via hole, the third via hole and the fourth via hole,
in at least one repeating unit group, the first via hole, the third via hole and the fourth via hole are located on a lower side of the repeating unit group in the second direction, and are arranged in a straight line parallel to the first direction, and a distance between the third via hole and the fourth via hole is greater than a distance between the first via hole and the third via hole; the second via hole corresponding to the repeating unit group is located on an upper side of the repeating unit group in the second direction, and the first via hole, the third via hole and the fourth via hole in another repeating unit group adjacent to the upper side of the first sub-pixel pair are arranged in the straight line parallel to the first direction,
the via holes located on one side of at least one repeating unit group in the second direction are repeatedly arranged in sequence according to the order of the first via hole, the third via hole, the second via hole and the fourth via hole.

14. The pixel arrangement structure according to claim 1, wherein two edges opposite to each other of the pixel defining layer openings of the two first sub-pixels in the first sub-pixel pair extend in the first direction,
the pixel defining layer openings of any adjacent two of the first sub-pixel, the second sub-pixel and the third sub-pixel have approximately parallel opposite edges, and a perpendicular bisector of one edge of the opposite edges passes through the other edge.

15. The pixel arrangement structure according to claim 1, wherein a minimum distance between any two of the pixel defining layer opening of the first sub-pixel pair, the pixel defining layer opening of the second sub-pixel and the pixel defining layer opening of the third sub-pixel is a first distance, a minimum distance between the pixel defining layer openings of the two first sub-pixels of the first sub-pixel pair is a second distance, and the second distance is less than the first distance.

16. The pixel arrangement structure according to claim 15, wherein the first distance is in a range of 18~26 μm, and the second distance is in a range of 13~16 μm.

17. The pixel arrangement structure according to claim 15, wherein a minimum distance between the anode electrodes of the two first sub-pixels in the first sub-pixel pair is in a range of 8~15 μm.

18. A pixel arrangement structure, comprising a plurality of repeating units, wherein
at least one of the plurality of repeating units comprises two first sub-pixels, one second sub-pixel, and one third sub-pixel;
in at least one of the plurality of repeating units, the two first sub-pixels form a first sub-pixel pair; the one second sub-pixel, the first sub-pixel pair, and the one third sub-pixel are arranged in a first direction; and the two first sub-pixels in the first sub-pixel pair are arranged in a second direction intersecting the first direction;
the plurality of repeating units are arranged in the first direction to form a plurality of repeating unit groups, and the plurality of repeating unit groups are arranged in the second direction;

the repeating units in adjacent ones of the plurality of repeating unit groups are misaligned with each other in the second direction, and the repeating units in two repeating unit groups which are separated from each other by one repeating unit group are aligned with each other in the second direction, at least one of the first sub-pixel, the second sub-pixel and the third sub-pixel comprises a pixel defining layer, the pixel defining layer comprises a pixel defining layer opening to define an effective light emitting region of the sub-pixel, a minimum distance between the pixel defining layer opening of the first sub-pixel pair and the pixel defining layer opening of the second sub-pixel is a first distance, a minimum distance between the pixel defining layer opening of the first sub-pixel pair and the pixel defining layer opening of the third sub-pixel is a second distance, a minimum distance between the pixel defining layer opening of the second sub-pixel and the pixel defining layer opening of the third sub-pixel is a third distance, a minimum distance between the pixel defining layer openings of the two first sub-pixels in the first sub-pixel pair is a fourth distance, the first distance, the second distance and the third distance are all greater than the fourth distance.

19. The pixel arrangement structure according to claim 18, wherein a distance between centers of the two first sub-pixels in at least one of the repeating unit is a fifth distance, and a minimum distance along the second direction between centers of two first sub-pixels which are respectively from two adjacent repeating unit groups is sixth distance, and a ratio of the fifth distance to the sixth distance is in a range from 1 to 1.5.

20. A display device, comprising:
a base substrate; and
the pixel arrangement structure according to claim 1 formed on the base substrate.

* * * * *